(12) United States Patent
Matsunami et al.

(10) Patent No.: US 8,207,088 B2
(45) Date of Patent: Jun. 26, 2012

(54) TRANSFER SUBSTRATE AND METHOD FOR FABRICATING ORGANIC ELECTROLUMINESCENT ELEMENT

(75) Inventors: Shigeyuki Matsunami, Kanagawa (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 987 days.

(21) Appl. No.: 12/190,740

(22) Filed: Aug. 13, 2008

(65) Prior Publication Data

US 2009/0045735 A1   Feb. 19, 2009

(30) Foreign Application Priority Data

Aug. 16, 2007   (JP) .................................. 2007-212025

(51) Int. Cl.
  *B41M 5/035*   (2006.01)
  *B32B 9/00*   (2006.01)
(52) U.S. Cl. ........................................ 503/227; 428/690
(58) Field of Classification Search .................... None
  See application file for complete search history.

(56) References Cited

FOREIGN PATENT DOCUMENTS

| | | |
|---|---|---|
| JP | 09-241629 | 9/1997 |
| JP | 10-006643 | 1/1998 |
| JP | 11-260549 | 9/1999 |
| JP | 2002-110350 | 4/2002 |
| JP | 2002-216957 | 8/2002 |
| JP | 2003-229259 | 8/2003 |
| JP | 2003-347058 | 12/2003 |
| JP | 2004-071550 | 3/2004 |
| JP | 2005-063938 | 3/2005 |

OTHER PUBLICATIONS

Japanese Patent Office Action dated Sep. 15, 2009 corresponding to Japanese Serial No. 2007-212025.

*Primary Examiner* — Bruce H Hess
(74) *Attorney, Agent, or Firm* — SNR Denton US LLP

(57) ABSTRACT

A transfer substrate includes a light transmissive support substrate; a light-heat conversion layer formed on the light transmissive support substrate; and a transfer layer formed on the light heat conversion layer. The transfer layer is a layer transferred as a luminescent layer of an organic electroluminescent element and is made of a metal complex, a fluorescent luminescent dopant and an aromatic hydrocarbon whose matrix skeleton has four to seven rings.

7 Claims, 10 Drawing Sheets

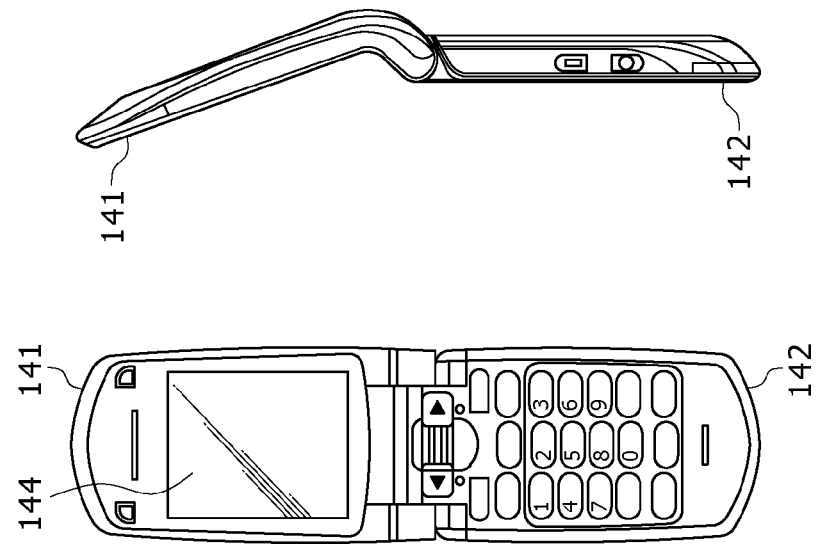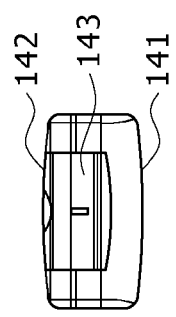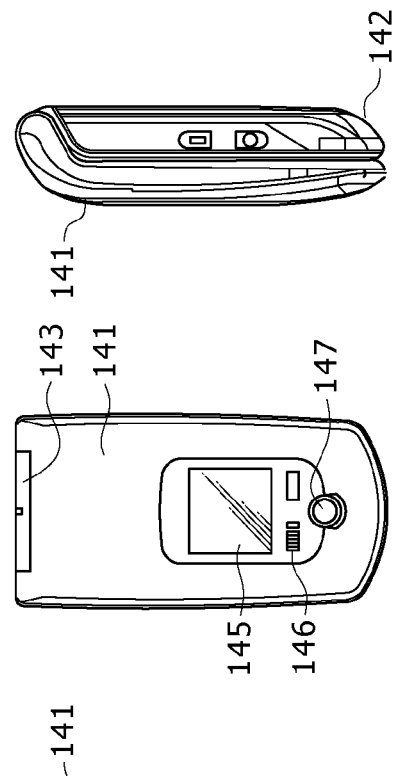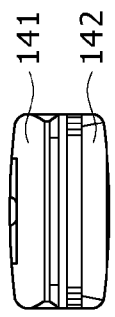

TRANSFER SUBSTRATE AND METHOD FOR FABRICATING ORGANIC ELECTROLUMINESCENT ELEMENT

CROSS REFERENCES TO RELATED APPLICATIONS

The present invention contains subject matter related to Japanese Patent Application JP 2007-212025, filed in the Japan Patent Office on Aug. 16, 2007, the entire contents of which being incorporated herein by reference.

BACKGROUND OF THE INVENTION

1. Field of the Invention

The present invention relates to a transfer substrate and a method for fabricating an organic electroluminescent element. More particularly, the present invention relates to a transfer substrate adapted for use in pattern formation of a luminescent layer and also to a method for fabricating an organic electroluminescent element using the transfer substrate.

2. Description of the Related Art

In recent years, attention has been drawn to display devices using organic electroluminescent elements (so-called organic EL element) as a flat panel display device that is lightweight and high in efficiency.

The organic electroluminescent element used for such a display device is provided on a transparent substrate such as, for example, glass and is so arranged that an anode made of ITO (indium tin oxide: transparent electrode), an organic layer and a cathode are laminated in this order as viewed from the substrate side. The organic layer has such an arrangement that a hole injection layer, a hole transport layer and an electron transportable luminescent layer are successively laminated as viewed from the anode side. With the organic electroluminescent element thus arranged, the electrons injected from the cathode and the holes injected from the anode are re-combined at the luminescent layer, whereupon light is taken out from the substrate side through the anode.

A full-color display device using such organic electroluminescent elements is formed such that organic electroluminescent elements of individual colors including R (red), G (green) and B (blue) are arrayed on a substrate. In the manufacture of such a display device, luminescent layers made of organic light-emitting materials capable of emitting the respective colors should be formed in pattern for every luminescent element. The pattern formation of the luminescent layers is now carried out, for example, according to a shadow masking process wherein a luminescent material is vacuum deposited or coated through a mask formed with an opening pattern in a sheet or by an ink jet technique.

In the pattern formation made by the shadow masking process, a difficulty has been involved in further miniaturization and a high degree of integration of organic electroluminescent elements because of a difficulty in further microfabrication of an opening pattern formed in the mask and also of a difficulty in pattern formation of high positional accuracy in a luminescent element region owing to the flexibility and elongation of the mask. Upon contact of the mask formed with an opening pattern therein, functional layers including a previously formed organic layer are liable to break, thereby causing a production yield to be lowered.

The pattern formation by the ink jet process is limited in patterning accuracy, for which a difficulty is involved in microfabrication and a high degree of integration of luminescent elements and also in the formation of a large-sized substrate.

To avoid this, there has been proposed a transfer process (i.e. a heat or thermal transfer process) using an energy source (heat source) as a new pattern forming process of a luminescent layer constituted of an organic material and other functional layers. The display device using the thermal transfer process is manufactured, for example, in the following way. Initially, a lower electrode is formed on a substrate of a display device (hereinafter referred to as "device substrate"). On the other hand, a luminescent layer is formed on another substrate (hereinafter referred to "transfer substrate") through a light-heat conversion layer. The device substrate and the transfer substrate are arranged so that the luminescent layer and the lower electrode are facing each other, under which a laser beam is irradiated from the transfer substrate side thereby causing the luminescent layer to be thermally transferred onto the lower electrode of the device substrate. At this stage, when the spot irradiated laser beam is scanned, the luminescent layer is thermally transferred only at a given region on the lower electrode in high positional accuracy (see Japanese Patent Laid-open Nos. 2002-110350 and Hei 11-260549).

With respect to an organic electroluminescent element fabricated according to the thermal transfer process, there has been proposed a method of improving a luminescent efficiency and a luminance half-time life by subjecting a device substrate and a transfer substrate to heat treatment prior to heat or thermal transfer of a luminescent layer (see Japanese Patent Laid-open No. 2003-229259).

Further, there has been proposed a method of increasing sensitivity wherein a sublimating compound is used as a donor of high sensitivity of a laser-induction thermal image-forming system (see Japanese Patent Laid-open No. Hei 10-6643).

On the other hand, there has been disclosed a technique wherein a compound having an aromatic ring having four or more condensed polycyclic hydrocarbons is used as a dopant in a luminescent layer of an organic electroluminescent element (see Japanese Patent Laid-open No. Hei 9-241629).

However, the luminescent elements obtained by use of such thermal transfer processes have problems in that the transfer layer degrades by laser irradiation although depending on the types of organic materials used for the transfer layer, so that when compared with a luminescent element made by the shadow mask process, the luminescent efficiency becomes lower, the drive voltage increases, and the luminance half-time life becomes shorter. Thus, the improvements made by such techniques as set out above are not satisfactory with respect to the effects brought about thereby.

SUMMARY OF THE INVENTION

It is desirable to provide a transfer substrate used for the manufacture of an organic electroluminescent element that is able to keep a high luminescent efficiency and luminance half-time life.

It is also desirable to provide a method for fabricating an organic electroluminescent element that makes use of such a transfer substrate as mentioned above and is able to improve a luminescent efficiency and a luminance half-time life.

In order to achieve the above desire, an embodiment of the present invention provides a transfer substrate including a light transmissive support substrate, a light-heat conversion layer formed on the support substrate, and a transfer layer formed on the light-heat conversion layer wherein the transfer layer is a layer to be transferred as a luminescent layer of the organic electroluminescent element and is made of a mixture of a metal complex, a fluorescent luminescent dopant and an aromatic hydrocarbon whose matrix skeleton has four to seven rings, or is tetracyclic to heptacyclic.

Further, another embodiment of the present invention provides a method for fabricating an organic electroluminescent element using such a transfer substrate as mentioned above, which is characterized in that a luminescent layer is formed by use of the transfer substrate. In this case, a transfer substrate is placed in face-to-face relation with a device substrate under conditions where the transfer layer is directed toward the device substrate side. The transfer layer is sublimated by beam irradiation from the support substrate side to transfer the transfer layer above the device substrate thereby forming a luminescent layer.

In such an arrangement as set out above, since the transfer layer of the transfer substrate is made of a ternary material of a metal complex, a fluorescent luminescent dopant and an aromatic hydrocarbon whose matrix skeleton has four to seven rings, the resulting luminescent layer formed by sublimation of the transfer layer is constituted of the ternary material. It has been confirmed that although the aromatic hydrocarbon does not contribute to luminescence in the luminescent layer made up of such a ternary material, a higher luminescent efficiency and a longer luminance half-time life are achieved over the case containing no aromatic hydrocarbon. Moreover, such a luminescent layer is higher in uniformity of mixing state of the three types of material and has more accurately controlled material ratios than that obtained by a vacuum co-deposition process.

Hence, according to the embodiments of the present invention, there can be obtained a luminescent layer made of a ternary material, which ensures a high luminescent efficiency and an improved luminance half-time life, in high uniformity and at material ratios of high accuracy. Using this luminescent layer, there can be obtained an organic electroluminescent element which is further improved in luminescent efficiency and luminance half-time life.

BRIEF DESCRIPTION OF THE DRAWINGS

FIGS. 9A and 9B are schematic views showing a digital camera to which the present invention is applied, wherein FIG. 9A is a perspective view of the camera as viewed from a front side and FIG. 9B is a perspective view of the camera as viewed from a back side;

FIGS. 12A to 12G are schematic views showing a mobile device, to which the present invention is applied, wherein FIG. 12A is a plan view of the device in an opened state, FIG. 12B is a side view, FIG. 12C is a plan view of the device in a closed state, FIG. 12D is a left side view, FIG. 12E is a right side view, FIG. 12F is a top view, and FIG. 12G is a bottom view.

DETAILED DESCRIPTION OF THE PREFERRED EMBODIMENTS

Embodiments of the invention are now described with reference to the accompanying drawings. In the following embodiments, there are illustrated a transfer substrate used in the case where a full-color display device is fabricated wherein organic electroluminescent elements of the respective colors including red (R), green (G) and blue (B) are arrayed on a substrate, and also a method for fabricating a display device using the transfer substrate.

<Transfer Substrate>

Figure 1:
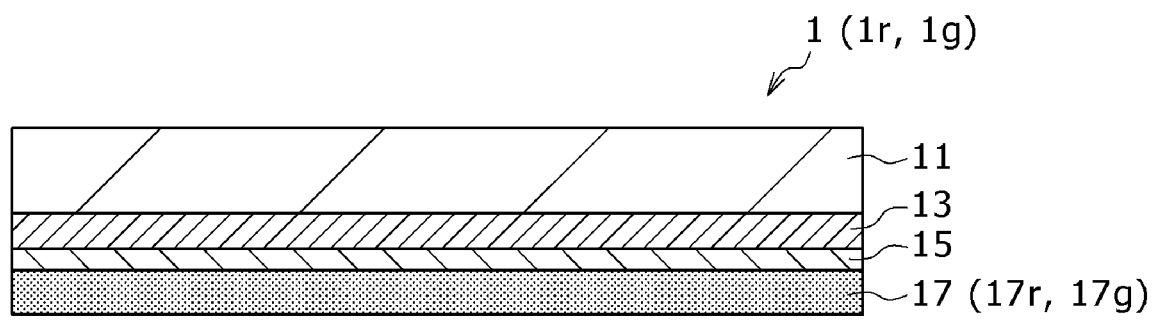
FIG. 1 is a schematic sectional view showing a transfer substrate according to an embodiment of the present invention.

FIG. 1 is a sectional view illustrating an arrangement of a transfer substrate 1 according to an embodiment of the invention. The transfer substrate 1 of this figure is one, with which a luminescent layer of an organic electroluminescent element is formed, and includes a support substrate 11, on which a light-heat conversion layer 13, an oxidation protective film 15, if necessary, and a transfer layer 17 are formed in this order.

The support substrate 11 is made of a material capable of being transmitting with light hv of a given wavelength that is irradiated in the course of transfer by use of this transfer substrate 1. For instance, where a laser beam with a wavelength of about 800 nm from a solid laser light source is used as this light hv, a glass substrate may be used as the support substrate 11.

The light-heat conversion layer 13 is made of a material that has a high light-heat conversion efficiency of converting the light hv to heat and a high melting point. For instance, where the afore-indicated laser beam with a wavelength of about 800 nm is used as the light hv, the light-heat conversion layer 12 is preferably made of a high melting metal with a low reflectance such as chromium (Cr), molybdenum (Mo) or the like although not limited thereto. This light-heat conversion layer 12 should be so controlled in thickness as to obtain a necessary and sufficient light-heat conversion efficiency. For example, where the light-heat conversion layer 12 is constituted of a molybdenum (Mo) film, a film thickness of about 200 nm is used. The light-heat conversion layer 13 is formed herein, for example, by a sputtering method wherein Mo is formed in a thickness of 200 nm.

The oxidation protective layer 15 is made of silicon nitride ($SiN_x$) or silicon oxide ($SiO_2$). The oxidation protective layer 15 made of the just-mentioned material is formed, for example, by a CVD (chemical vapor deposition) process.

The transfer layer 17 is constituted of a) a metal complex, b) a fluorescent luminescent dopant, and c) an aromatic hydrocarbon whose matrix skeleton has four to seven rings. These materials are described in more detail hereinafter.

The three types of these materials may be all mixed together and formed as a single layered structure for use as the transfer layer 17, or may be formed as a double-layered structure including a mixed layer of a) metal complex+b) fluorescent luminescent dopant, and a layer of c) aromatic hydrocarbon. Alternatively, a three-layered structure wherein the respective materials are formed as a single layer may be used.

It will be noted that the ratio of c) aromatic hydrocarbon to the total of the three materials in the transfer layer 17 is not larger than 50 wt %.

The transfer layer 17 may contain, aside from the three types of materials, solvents used for the formation of the transfer layer 17.

Next, a) metal complex, b) fluorescent luminescent dopant and c) aromatic hydrocarbon are now described in detail.

a) Metal Complex a) Meal complex is preferably a quinolilato complex of the Group XIII metal of the Periodic Table. More particularly, quinolilato complexes wherein quinolinol is coordinated to a metal selected from aluminium, gallium and indium, or aluminium complexes are preferred. It will be noted that aluminium complexes may be those disclosed in Japanese Patent Laid-open Nos. Sho 63-264692, Hei 3-255190, Hei 5-70733, Hei 5-258859, Hei 6-215874 and the like.

Specific examples of such a) metal complex include tris(8-quinolinolato)aluminium, bis(2-methyl-8-quinolinolato)aluminium oxide, tris(8-quinolinolato)indium, tris(5-methyl-8-quinolinolato)aluminium, tris(5-chloro-8-quinolinolato) gallium, 5,7-dichloro-8-quinolinoloato aluminium, tris(5,7-dibromo-8-quinolinolato)aluminium, and the like.

Aside from 8-quinolinol or derivatives thereof, aluminium complexes having other types of ligands may be used and include bis(2-methyl-8-quinolinolato)(phenolato)aluminium (III), bis(2-methyl-8-quinolinolato)(ortho-cresolato)aluminium (III), bis(2-methyl-8-quinolinolato)(meta-cresolato) aluminium (III), bis(2-methyl-8-quinolinolato)(para-cresolato)aluminium (III), bis(2-methyl-8-quinolinolato)(ortho-phenylphenolato)aluminium (III), bis(2-methyl-8-quinolinolato)(meta-phenylphenolato)aluminium (III), bis (2-methyl-8-quinolinolato)(para-phenylphenolato) aluminium (III), bis(2-methyl-8-quinolinolato)(2,3-dimethylphenolato)aluminium (III), bis(2-methyl-8-quinolinolato)(2,6-dimethylphenolato)aluminium (III), bis (2-methyl-8-quinolinolato)(3,4-dimethylphenolato) aluminium (III), bis(2-methyl-8-quinolinolato)(3,5-dimethylphenolato)aluminium (III), bis(2-methyl-8-quinolinolato)(3,5-di-tert-butylphenolato)aluminium (III), bis(2-methyl-8-quinolinolato)(2,6-diphenylphenolato)aluminium (III), bis(2-methyl-8-quinolinolato)(2,4,6-triphenylphenolato)aluminium (III), bis(2-methyl-8-quinolinolato)(2,3,6-trimethylphenolato)aluminium (III), bis(2-methyl-8-quinolinolato)(2,3,5,6-tetramethylphenolato) aluminium (III), bis(2-methyl-8-quinolinolato)(1-naphtholato)aluminium (III), bis(2-methyl-8-quinolinolato) (2-naphtholato)aluminium (III), bis(2,4-dimethyl-quinolinolato)(ortho-phenylphenolato)aluminium (III), bis (2,4-dimethyl-8-quinolinolato)(para-phenylphenolato) aluminium (III), bis(2,4-dimethyl-8-quinolinolato)(meta-phenylphenolato)aluminium (III), bis(2,4-dimethyl-8-quinolinolato)(3,5-dimethylphenolato)aluminium (III), bis (2,4-dimethyl-8-quinolinolato)(3,5-di-tert-butylphenolato) aluminium (III), bis(2-methyl-4-ethyl-8-quinolinolato) (para-cresolato)aluminium (III), bis(2-methyl-4-methoxy-8-quinolinolato)(para-phenylphenolato)aluminium (III), bis(2-methyl-5-cyano-8-quinolinolato)(ortho-cresolato) aluminium (III), bis(2-methyl-6-trifluoromethyl-8-quinolinolato)(2-naphtholato)aluminium (III), and the like.

Besides, there may be mentioned bis(2-methyl-8-quinolinolato)aluminium (III)-p-oxo-bis(2-methyl-8-quinolinolato) aluminium (III), bis(2,4-dimethyl-8-quinolinolato)aluminium (III)-p-oxo-bis(2,4-dimethyl-8-quinolinolato) aluminium (III), bis(4-ethyl-2-methyl-8-quinolinolato) aluminium (III)-p-oxo-bis(4-ethyl-2-methyl-8-quinolinolato)aluminium (III), bis(2-methyl-4-methoxyquinolinolato)aluminium (III)-p-oxo-bis(2-methyl-4-methoxyquinolinolato)aluminium (III), bis(5-cyano-2-methyl-8-quinolinolato)aluminium (III)-p-oxo-bis(5-cyano-2-methyl-8-quinolinolato)aluminium (III), bis(2-methyl-5-trifluoromethyl-8-quinolinolato)aluminium (III)-p-oxo-bis (2-methyl-5-trifluoromethyl-8-quinolinolato)aluminium (III), and the like.

b) Fluorescent Luminescent Dopant

As b) fluorescent luminescent dopant, an organic material capable of energy transfer with a) metal complex is preferred and should particularly be a green luminescent material or a red luminescent material. In this connection, a transfer substrate 1 provided thereon with a transfer layer 17g containing a green luminescent material is used as a transfer substrate 1g for forming a green luminescent layer. Likewise, a transfer substrate 1 provided with a transfer layer 17r containing a red luminescent material is used as a transfer substrate 1r for forming a red luminescent layer.

As a green luminescent material, there are used compounds having a luminescence peak within a wavelength range of about 490 nm to 580 nm. Such compounds are organic materials including naphthalene derivatives, anthracene derivatives, pyrene derivatives, naphthacene derivatives, fluoranthene derivatives, perylene derivatives, coumarin derivatives, quinacridone derivatives, indino[1,2,3-cd]perylene derivatives, bis(azinyl)methene boron complexes, pyrane dyestuffs and the like. Of these, preferred ones are selected from aminoanthracene derivatives, fluoranthene derivatives, coumarin derivatives, quinacridone derivatives, indino[1,2,3-cd] perylene derivatives, and bis(azinyl)methene boron complexes.

The red luminescent materials used include those illustrated below and including perylene derivatives of the general formula (1), diketopyrolo-pyrole derivatives of the general formula (2), pyromethene complexes of the general formula (3), pyrane derivatives of the general formula (4) or styryl derivatives of the general formula (5). The red luminescent materials are now described in more detail.

—Perylene Derivatives—

As a red luminescent material, there is used, for example, a compound of the following general formula (1) (diindino[1,2,3-cd]perylene derivative).

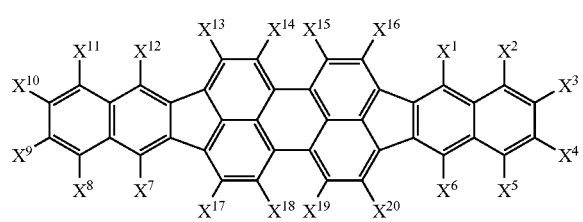

general formula (1)

In the general formula (1), $X^1$ to $X^{20}$ independently represent hydrogen, a halogen, a hydroxyl group, a substituted or unsubstituted carbonyl group having not larger than 20 carbon atoms, a substituted or unsubstituted carbonyl ester group having not larger than 20 carbon atoms, a substituted or unsubstituted alkyl group having not larger than 20 carbon atoms, a substituted or unsubstituted alkenyl group having not larger than 20 carbon atoms, a substituted or unsubstituted alkoxyl group having not larger than 20 carbon atoms, a cyano group, a nitro group, a substituted or unsubstituted silyl group having not larger than 30 carbon atoms, a substituted or unsubstituted aryl group having not larger than 30 carbon atoms, a substituted or unsubstituted heterocyclic group having not larger than 30 carbon atoms, or a substituted or unsubstituted amino group having not larger than 30 carbon atoms.

The aryl group represented by $X^1$ to $X^{20}$ in the general formula (1) includes, for example, a phenyl group, a 1-naphthyl group, a 2-naphthyl group, a flluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, a m-tolyl group, a p-tolyl group, a p-t-butylphenyl group or the like.

The heterocyclic group represented by $X^1$ to $X^{20}$ includes a five-membered or six-membered aromatic heterocyclic group containing O, N or S as a heteroatom and a condensed polycyclic aromatic heterocyclic group having 2 to 20 carbon atoms. These aromatic heterocyclic groups and condensed polycyclic aromatic heterocyclic group include a thienyl group, a furyl group, a pyrolyl group, a pyridyl group, a quinolyl group, a quinoxalyl group, an imidazopyridyl group, a benzothiazole group and the like. Typical examples include a 1-pyrolyl group, a 2-pyrolyl group, a 3-pyrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acrydinyl group, a 2-acrydinyl group, a 3-acrydinyl group, a 4-acrydinyl group, a 9-acrydinyl group and the like.

The amino group represented by $X^1$ to $X^{20}$ may be either of an alkylamino group, an arylamino group, an aralkylamino group or the like. These preferably have an aliphatic group having 1 to 6 carbon atoms in total and/or a 1 monocyclic to tetracyclic aromatic hydrocarbon ring. Such groups include a dimethylamino group, a diethylamino group, a dibutylamino group, a diphenylamino group, a ditolylamino group, a bis-biphenylamino group and a dinaphthylamino group.

Two or more of the above substituent groups may form a condensed ring and may have a further substituent.

Specific examples of the diindino[1,2,3-cd]perylene derivative suitably employed as a red luminescent material of the transfer layer 17 include those of the following compounds (1)-1 to (1)-8 although not limited to those compounds in the practice of the invention.

Compound (1)-1

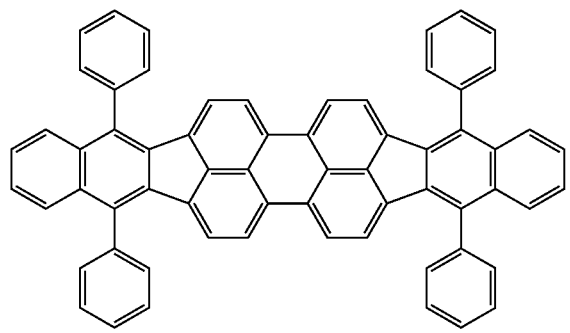

Compound (1)-2

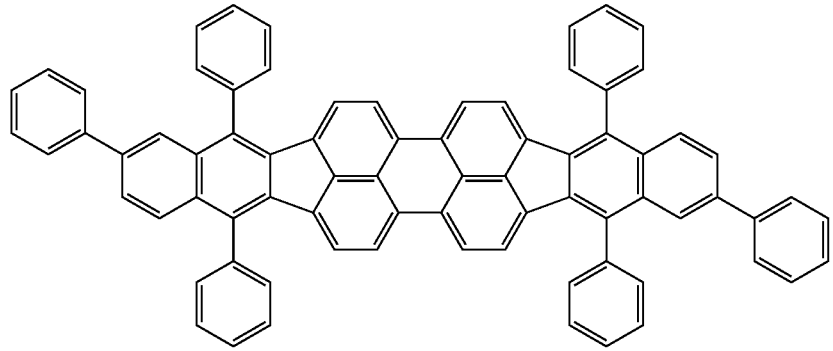

-continued
Compound (1)-3
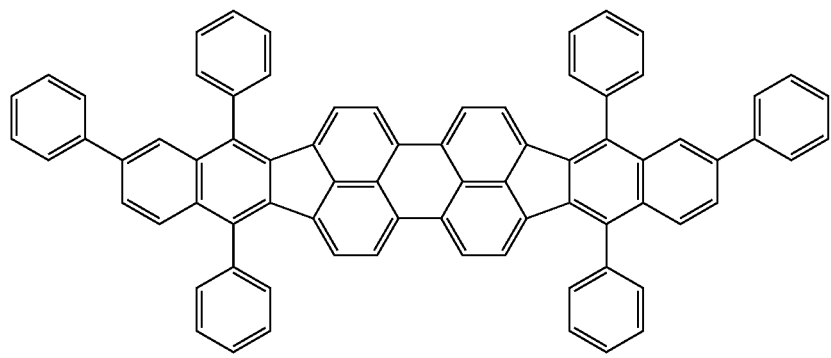
Compound (1)-4
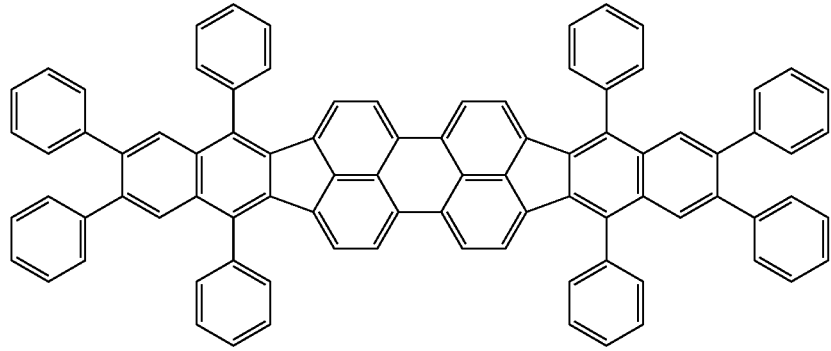
Compound (1)-5
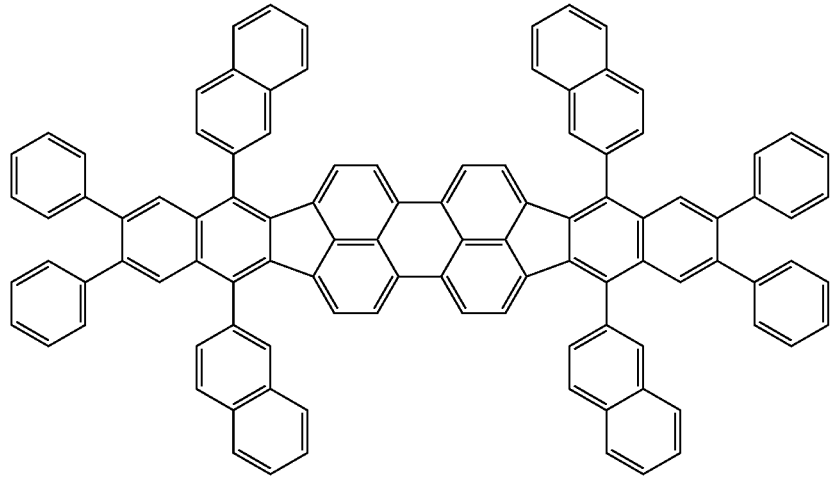
Compound (1)-6
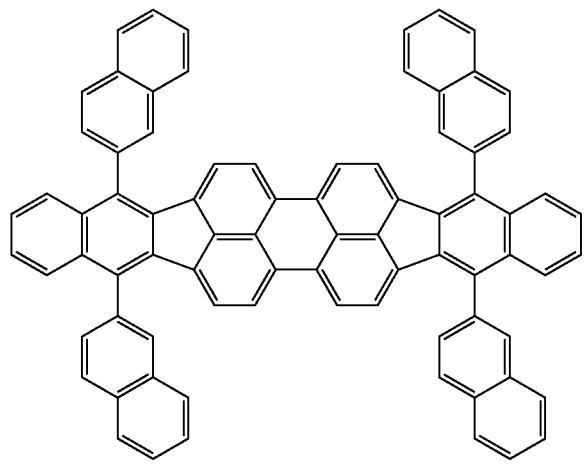
Compound (1)-7
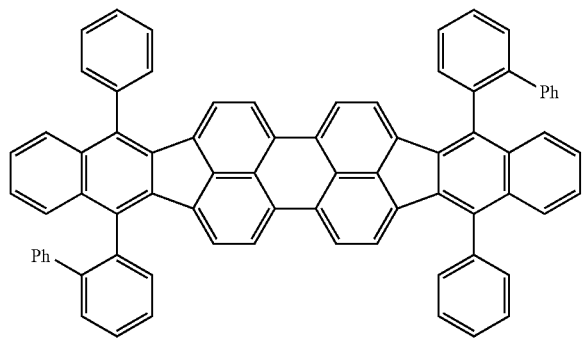

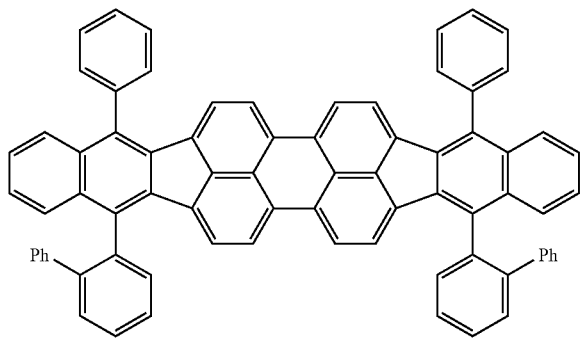

Compound (1)-8

—Diketopyrolopyrole Derivatives—

A compound of the following general formula (2) (i.e. a diketopyrolopyrole derivative) is used, for example, as a red luminescent material of the transfer layer 17

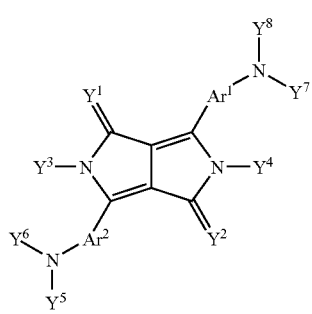

general formula (2)

wherein $Y^1$ and $Y^2$ independently represent an oxygen atom or a substituted or unsubstituted amino group, $Y^3$ to $Y^8$ independently represent hydrogen, a halogen, a substituted or unsubstituted alkyl group having not larger than 20 carbon atoms, a substituted or unsubstituted alkenyl group having not larger than 20 carbon atoms, a substituted or unsubstituted aryl group having not larger than 30 carbon atoms, a substituted or unsubstituted heterocyclic group having not larger than 30 carbon atoms, or a substituted or unsubstituted amino group having not larger than 30 carbon atoms, and $Ar^1$ and $Ar^2$ each represents a divalent group selected from a substituted or unsubstituted aromatic hydrocarbon group and a substituted or unsubstituted aromatic heterocyclic group.

In the general formula (2), the substituted or unsubstituted aryl group represented by $Y^3$ to $Y^8$, the heterocyclic group represented by $Y^3$ to $Y^8$, and the amino group represented by $Y^3$ to $Y^8$ are, respectively, same as those indicated with respect to the perylene derivative of the general formula (1). Two or more of the substituted groups may form a condensed ring and may further have a substituent group as in the foregoing case. Specific example of the diketopyrolopyrole derivative suited as a red luminescent material of the transfer layer 17 include those indicated as compounds to (2)-14 although not limited thereto in the practice of the invention.

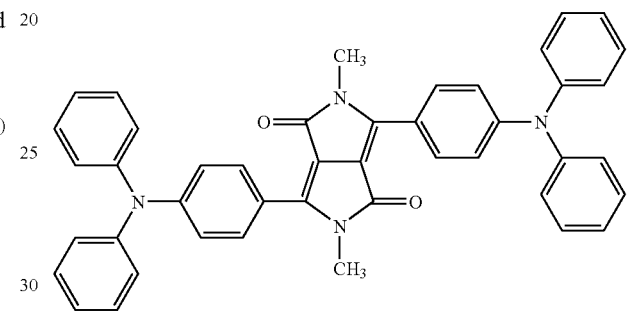

Compound (2)-1

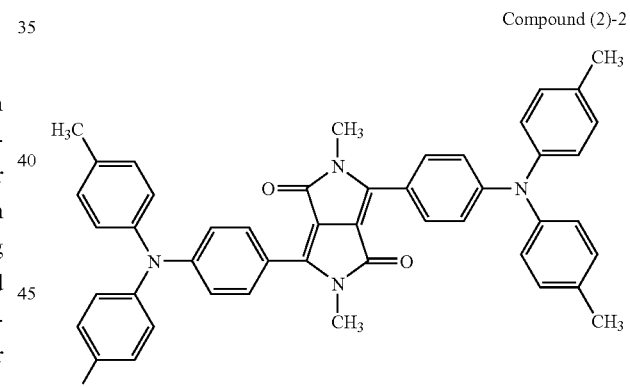

Compound (2)-2

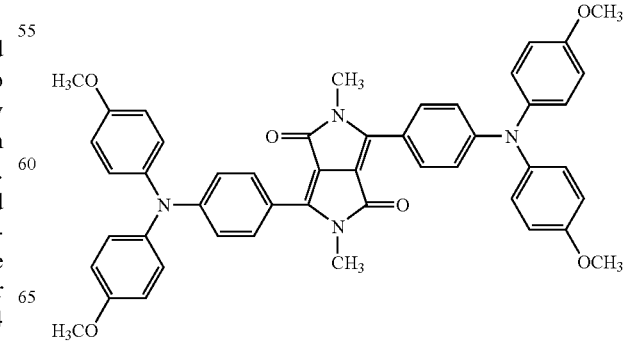

Compound (2)-3

Compound (2)-4
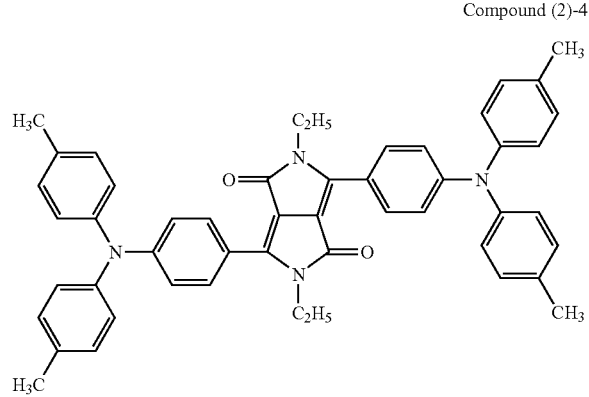
Compound (2)-5
Copmpound (2)-5
Compound (2)-6
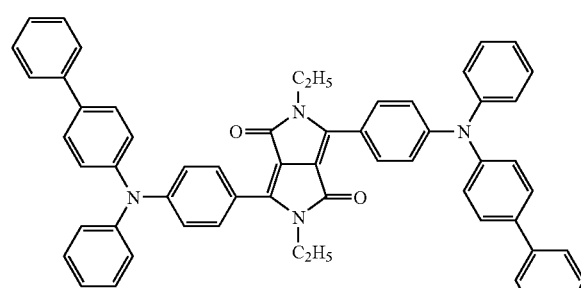
Compound (2)-7
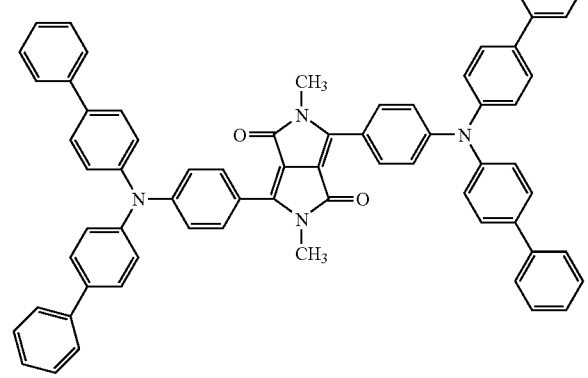
Compound (2)-8
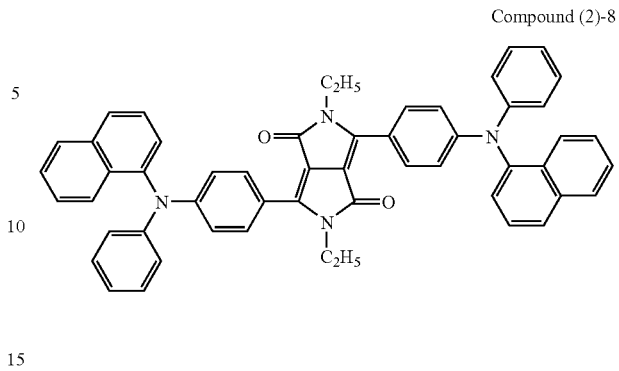
Compound (2)-9
Compound (2)-10
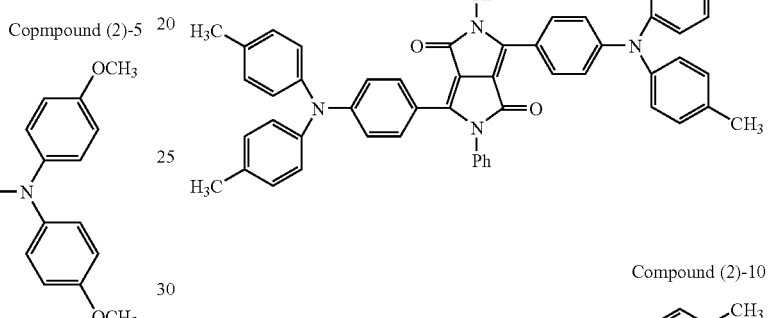
Compound (2)-11
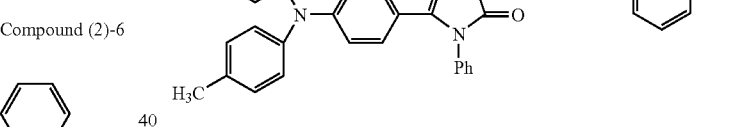
Compound (2)-12
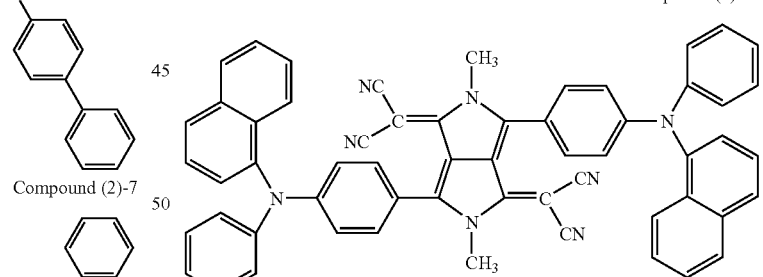

Compound (2)-13

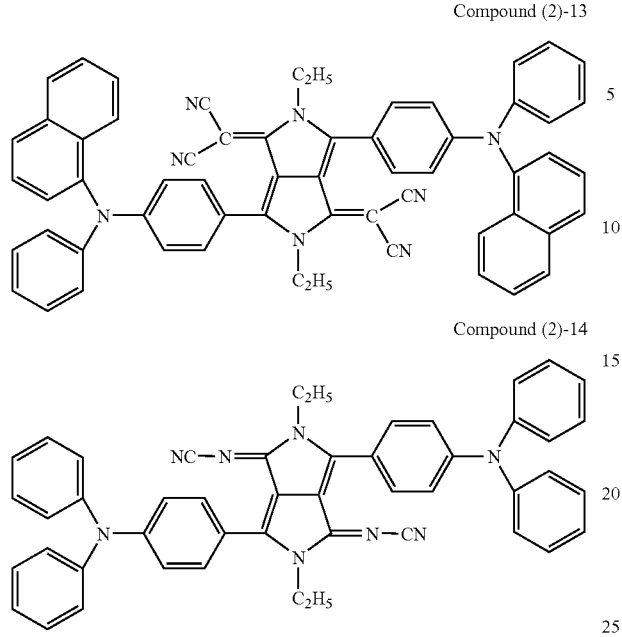

Compound (2)-14

Compound (3)-1

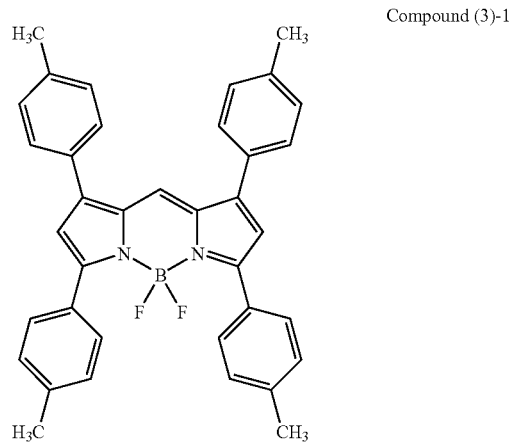

—Pyromethene Complexes—

As a red luminescent material of the transfer layer 17, there is used, for example, a compound (pyromethene complex) of the following general formula (3)

general formula (3)

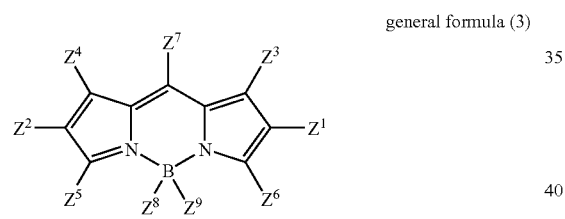

wherein $Z^1$ to $Z^9$ independently represent hydrogen, a halogen, a substituted or unsubstituted alkyl group having not larger than 20 carbon atoms, a substituted or unsubstituted alkenyl group having not larger than 20 carbon atoms, a substituted or unsubstituted alkoxyl group having not larger than 20 carbon atoms, a cyano group, a nitro group, a substituted or unsubstituted silyl group having not larger than 30 carbon atoms, a substituted or unsubstituted aryl group having not larger than 30 carbon atoms, a substituted or unsubstituted heterocyclic group having not larger than 30 carbon atoms, or a substituted or unsubstituted amino group having not larger than 30 carbon atoms.

In the general formula (3), the substituted or unsubstituted aryl group represented by $Z^1$ to $Z^9$, the heterocyclic group represented by $Z^1$ to $Z^9$, and the amino group represented by $Z^1$ to $Z^9$ are, respectively, same as those indicated with respect to the perylene derivative of the general formula (1). Two or more of the substituted groups may form a condensed ring and may further have a substituent group as in the foregoing case.

Specific examples of the pyromethene complex suited as a red luminescent material of the transfer layer 17 include the following compounds (3)-1 to (3)-33 although not limited to those compounds in the present invention.

Compound (3)-2

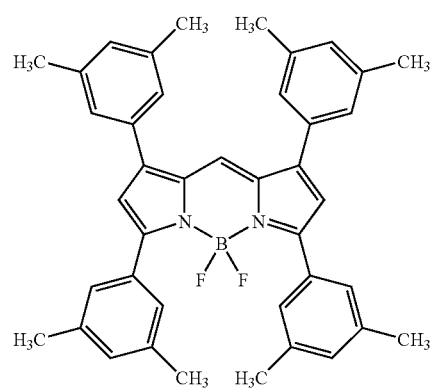

Compound (3)-3

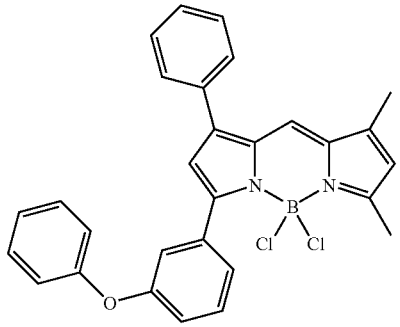

Compound (3)-4

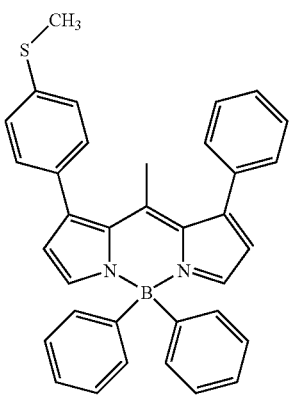

Compound (3)-5
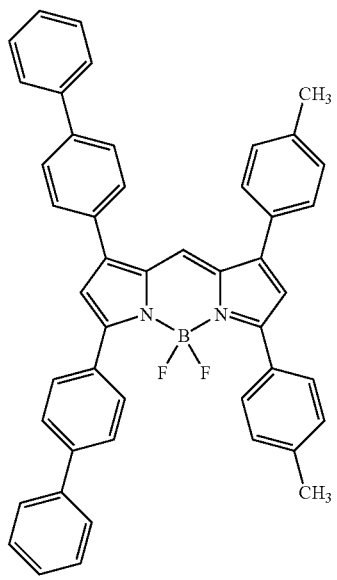
Compound (3)-6
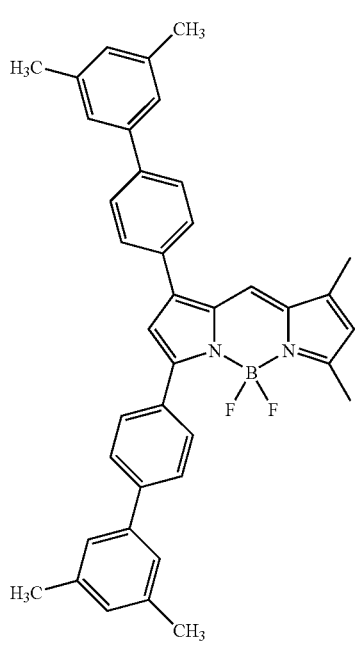
Compound (3)-7
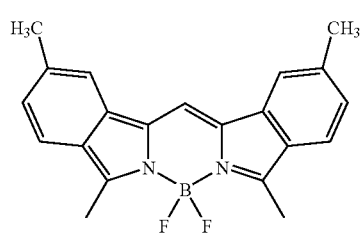
Compound (3)-8
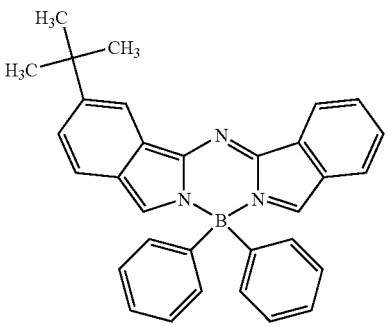
Compound (3)-9
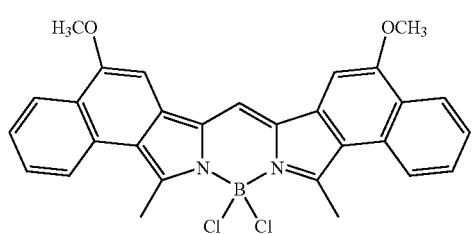
Compound (3)-10
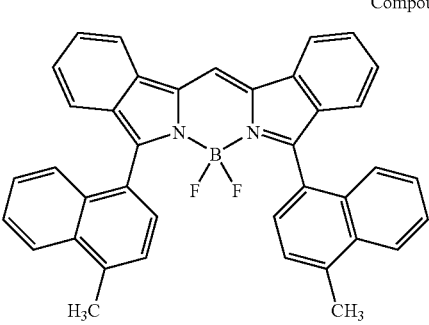
Compound (3)-11
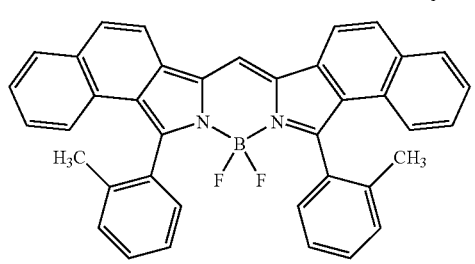
Compound (3)-12
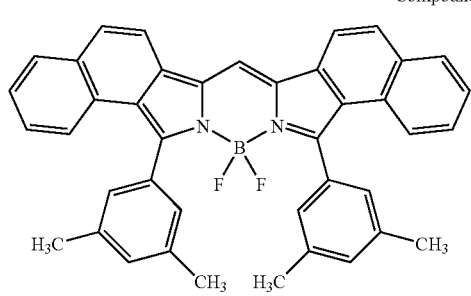

Compound (3)-13
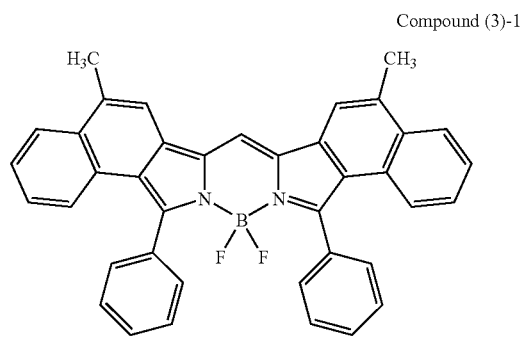
Compound (3)-14
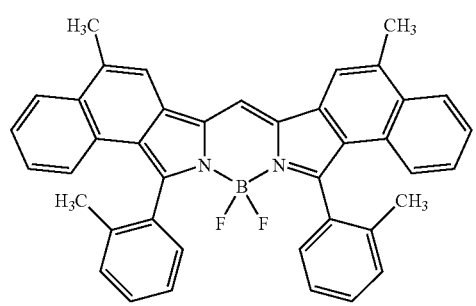
Compound (3)-15
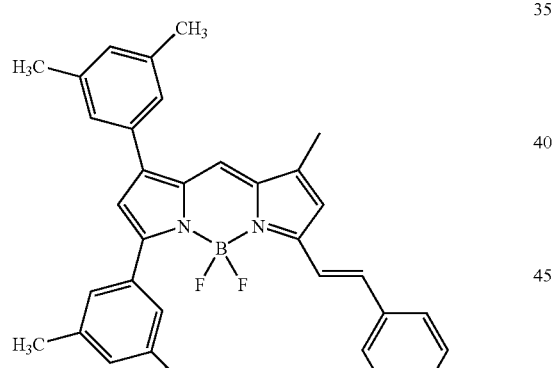
Compound (3)-16
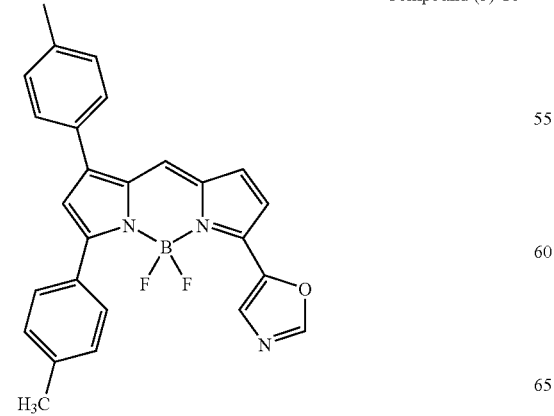
Compound (3)-17
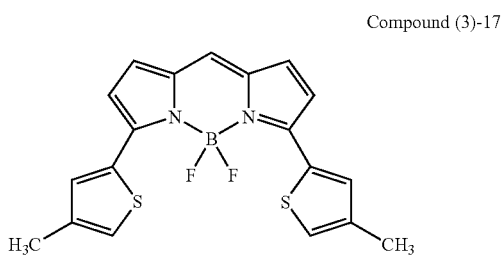
Compound (3)-18
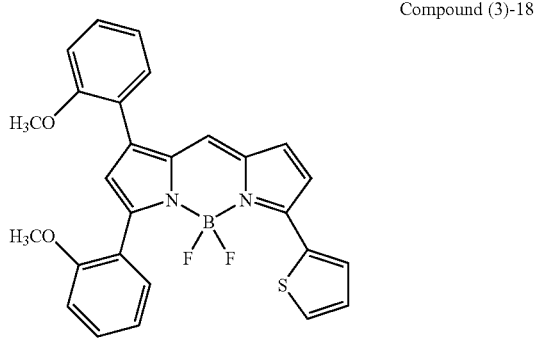
Compound (3)-19
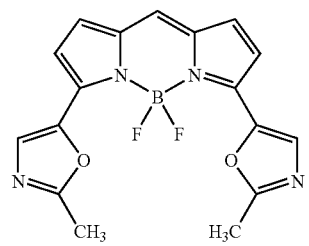
Compound (3)-20
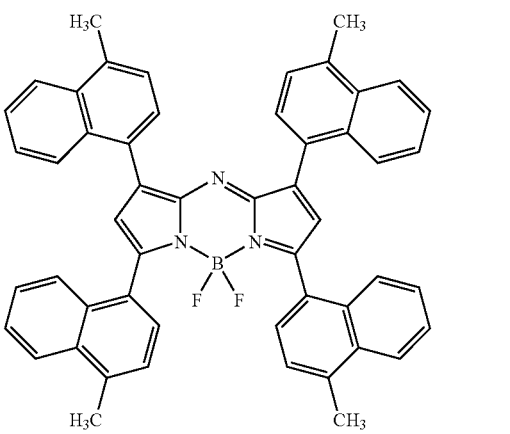

Compound (3)-21
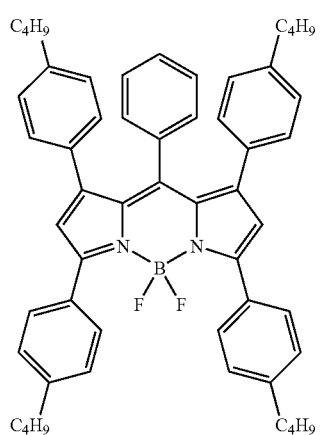
Compound (3)-22
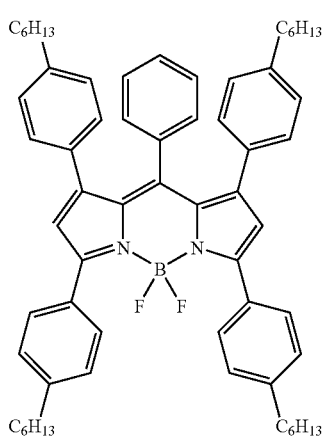
Compound (3)-23
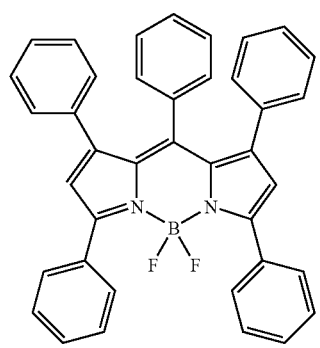
Compound (3)-24
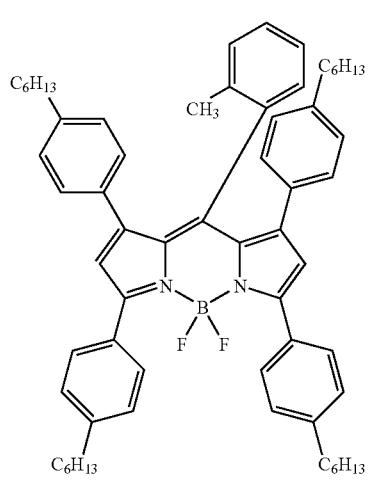
Compound (3)-25
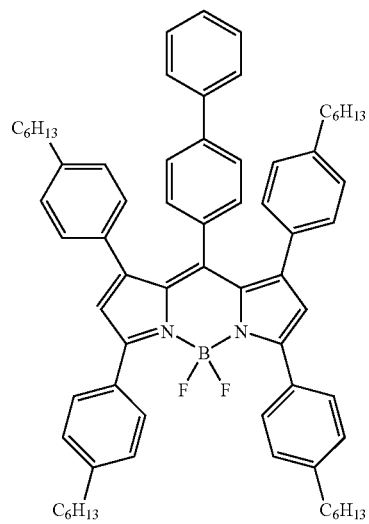
Compound (3)-26
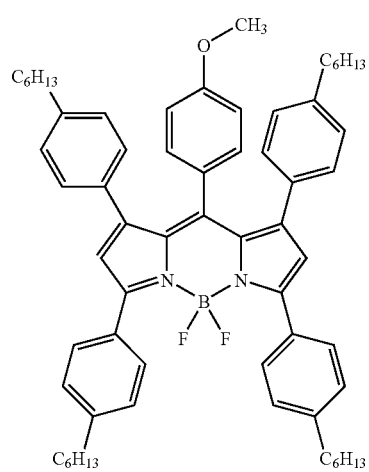
Compound (3)-27
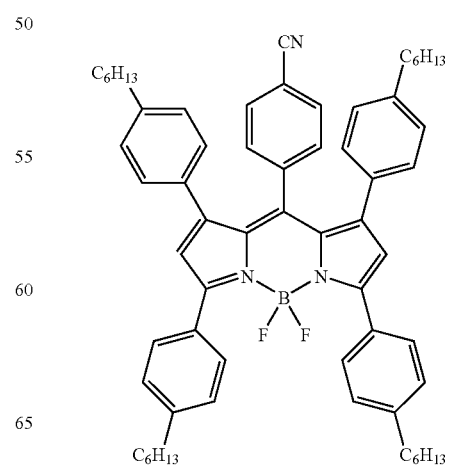

Compound (3)-28
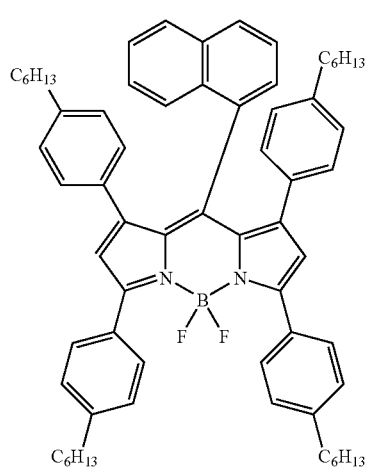
Compound (3)-29
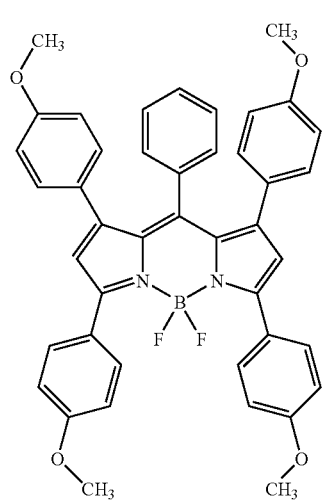
Compound (3)-30
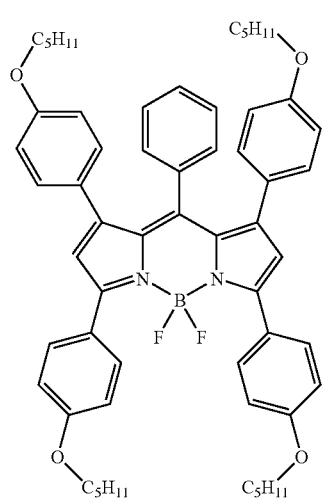
Compound (3)-31
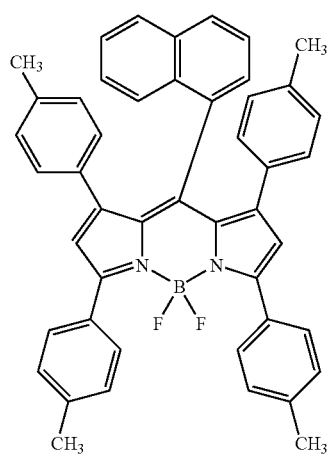
Compound (3)-32
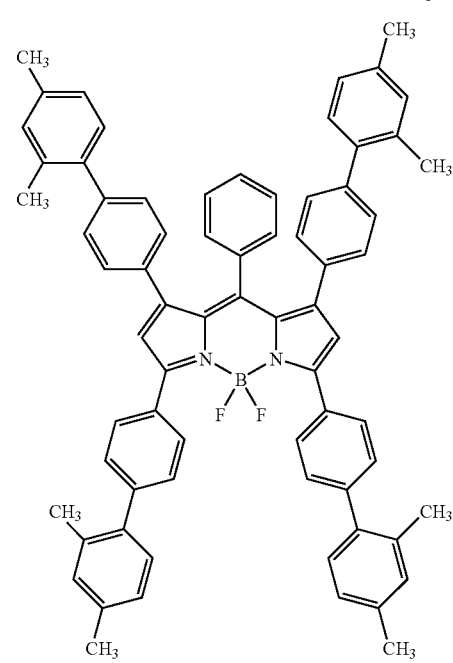
Compound (3)-33
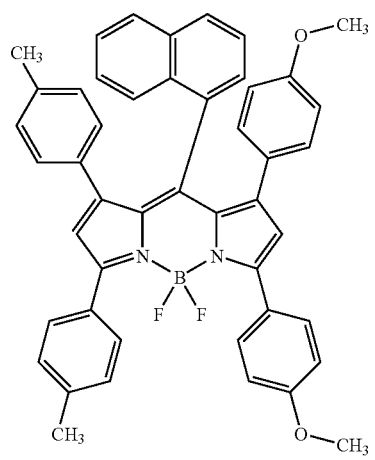
—Pyrane Derivatives—
The compound (pyrane derivative) represented, for example, by the following general formula (4) is used as a red luminescent material of the transfer layer 17 general formula (4)

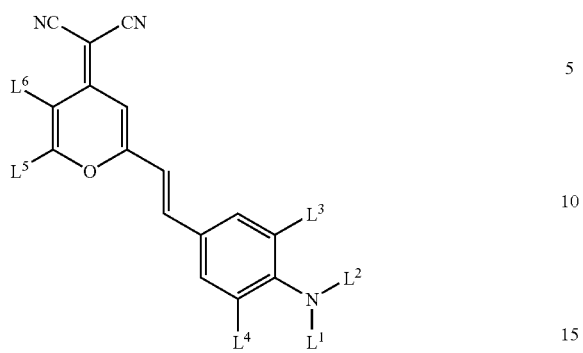

wherein $L^1$ to $L^6$ independently represent hydrogen, a substituted or unsubstituted alkyl group having not larger than 20 carbon atoms, a substituted or unsubstituted alkenyl group having not larger than 20 carbon atoms, a substituted or unsubstituted alkoxyl group having not larger than 20 carbon atoms, a cyano group, a nitro group, a substituted or unsubstituted silyl group having not larger than 30 carbon atoms, a substituted or unsubstituted aryl group having not larger than 30 carbon atoms, a substituted or unsubstituted heterocyclic group having not larger than 30 carbon atoms, or a substituted or unsubstituted amino group having not larger than 30 carbon atoms, and $L^1$ and $L^4$ or $L^2$ and $L^3$ may take a cyclic structure through a hydrocarbon.

In the general formula (4), the substituted or unsubstituted aryl group represented by $L^1$ to $L^6$, the substituted or unsubstituted heterocyclic group represented by $L^1$ to $L^6$, and the substituted or unsubstituted amino group represented by $L^1$ to $L^6$ are, respectively, similar to those groups represented with respect to the perylene derivatives of the general formula (1). Although $L^1$ and $L^4$ or $L^2$ and $L^3$ may take a cyclic structure through a hydrocarbon, two or more of the above substituents may form a condensed ring and may further have a substituent group.

Specific examples of pyrane derivative suited as a red luminescent material of the transfer layer 17 include the following compounds (4)-1 to (4)-7 although not limited thereto.

Compound (4)-1

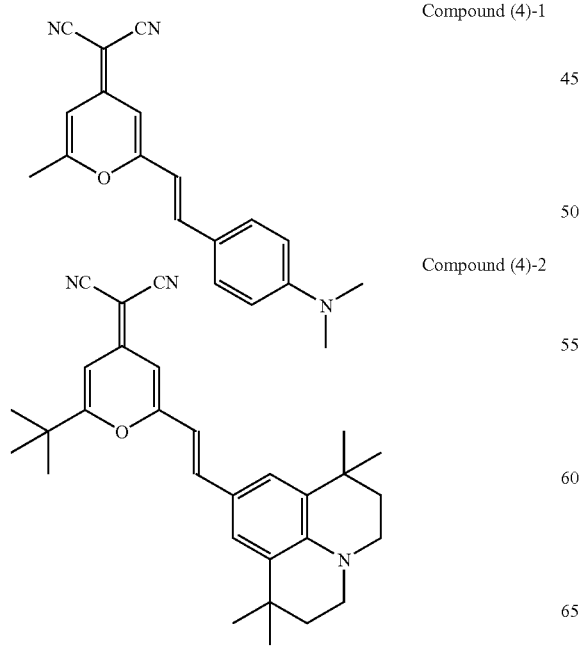

Compound (4)-2

Compound (4)-3

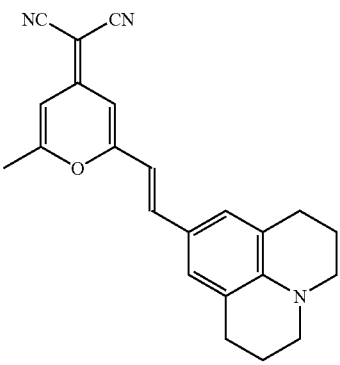

Compound (4)-4

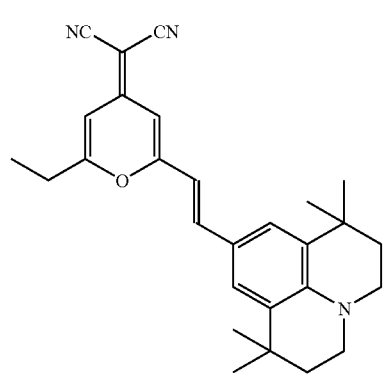

Compound (4)-5

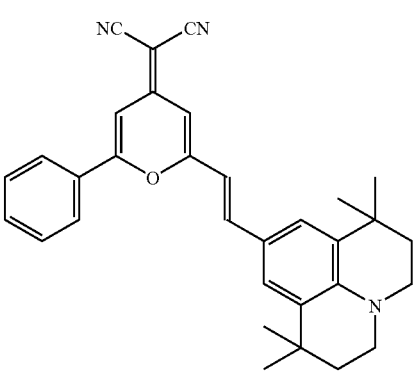

Compound (4)-6

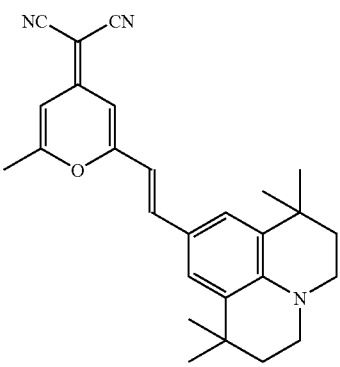

Compound (4)-7

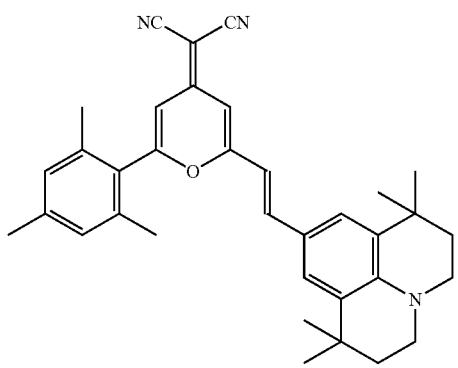

—Styryl Derivatives—

The compound represented, for example, by the following general formula (5) is used as a red luminescent material of the transfer layer 17 general formula (5)

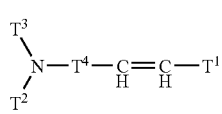

wherein $T^1$ to $T^3$ independently represent a substituted or unsubstituted aryl group having not larger than 30 carbon atoms, or a substituted or unsubstituted heterocyclic group having not larger than 30 carbon atoms, and $T^4$ represents a substituted or unsubstituted phenylene moiety that may have a cyclic structure.

In the general formula (5), the substituted or unsubstituted aryl group represented by $T^1$ to $T^3$ and the substituted or unsubstituted heterocyclic group represented by $T^1$ to $T^3$ are, respectively, similar to those groups represented with respect to the perylene derivative of the general formula (1).

Two or more of the above substituent groups may form a condensed ring and may further have a substituent group. In this connection, the group substituted to $T^1$ to $T^4$ includes, for example, hydrogen, a halogen, a hydroxyl group, a substituted or unsubstituted carbonyl group having not larger than 20 carbon atoms, a substituted or unsubstituted carbonyl ester group having not larger than 20 carbon atoms, a substituted or unsubstituted alkyl group having not larger than 20 carbon atoms, a substituted or unsubstituted alkenyl group having not larger than 20 carbon atoms, a substituted or unsubstituted alkoxyl group having not larger than 20 carbon atoms, a cyano group, a nitro group, an amino group or the like. Besides, the amino group may be any of an alkylamino group, an arylamino group, an aralkyl group or the like. These preferably have an aliphatic group having 1 to 6 carbon atoms in total and/or a moncyclic to tetracyclic aromatic hydrocarbon. Such groups include a dimethylamino group, a diethylamino group, a dibutylamino group, a diphenylamino group, a ditolylamino group, a bisbiphenylylamino group, a dinaphthylamino group and the like.

Specific examples of the styryl derivative suitably used as a red luminescent material of the transfer layer include the following compounds (5)-1 to 5-(35) although not limited to these in the practice of the invention.

Compound (5)-1

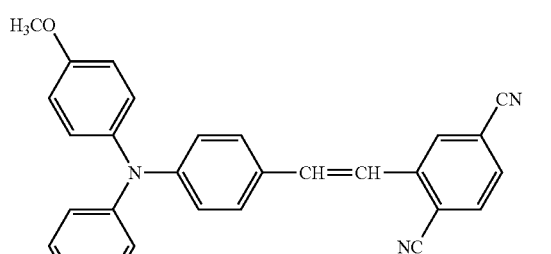

Compound (5)-2

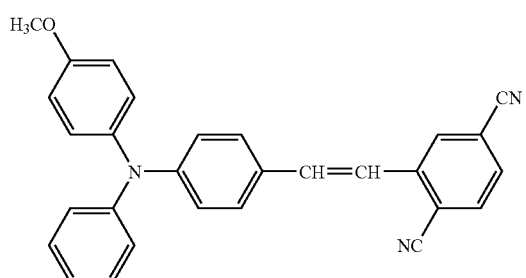

Compound (5)-3

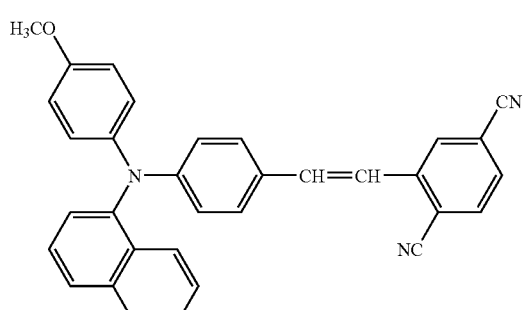

Compound (5)-4

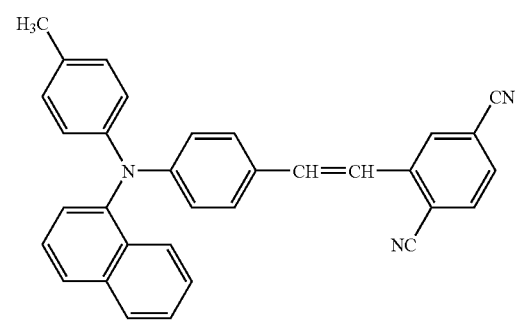

Compound (5)-5

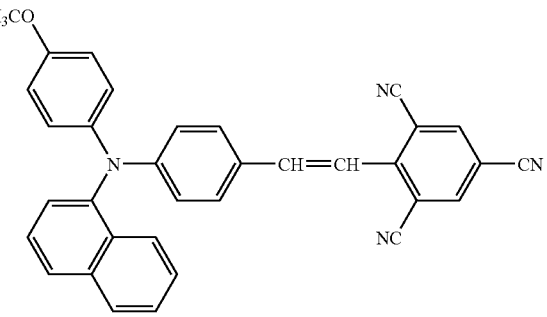

Compound (5)-6
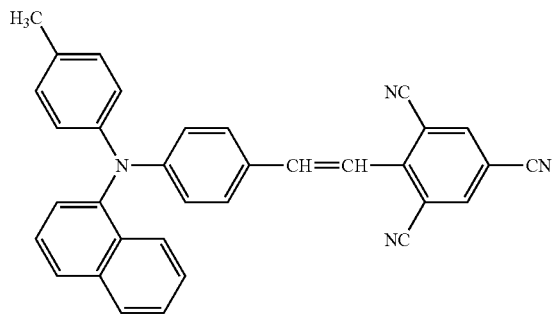
Compound (5)-7
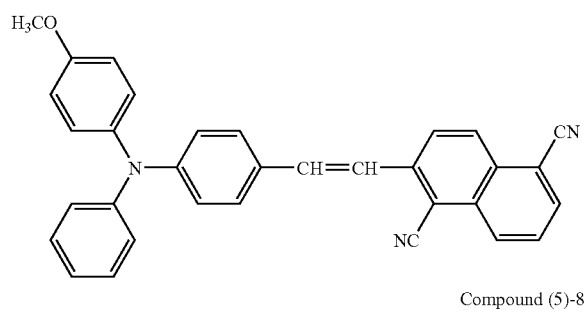
Compound (5)-8
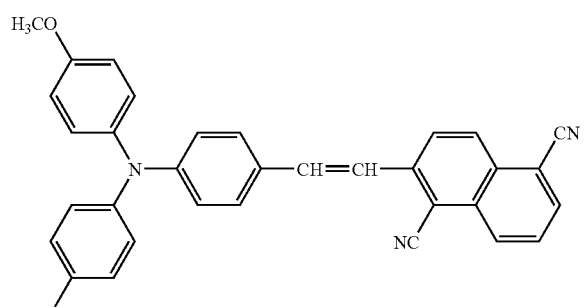
Compound (5)-9
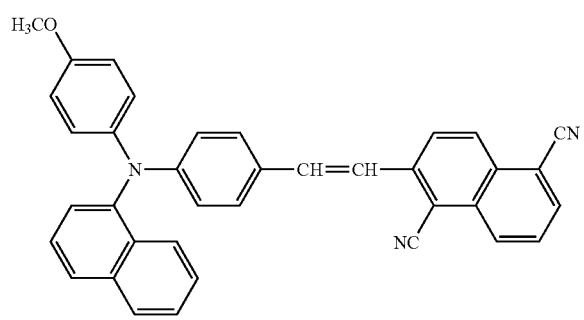
Compound (5)-10
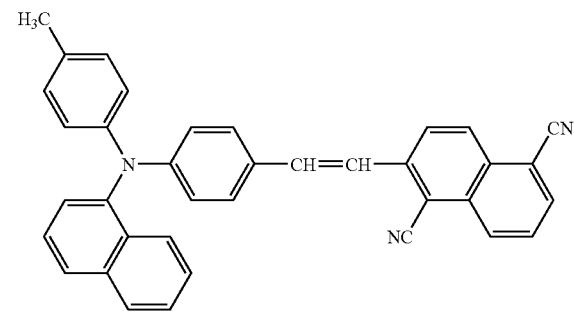
Compound (5)-11
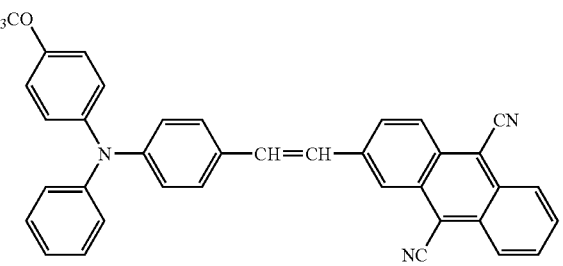
Compound (5)-12
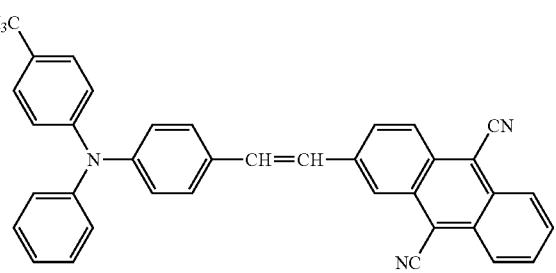
Compound (5)-13
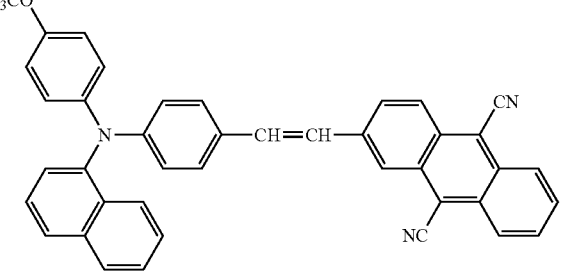
Compound (5)-14
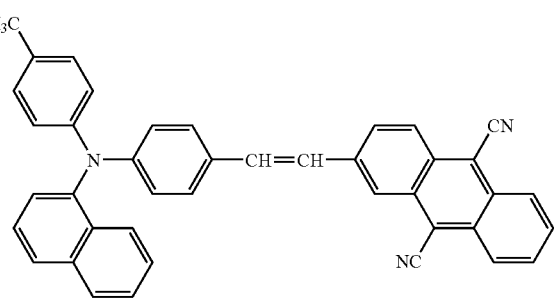
Compound (5)-15
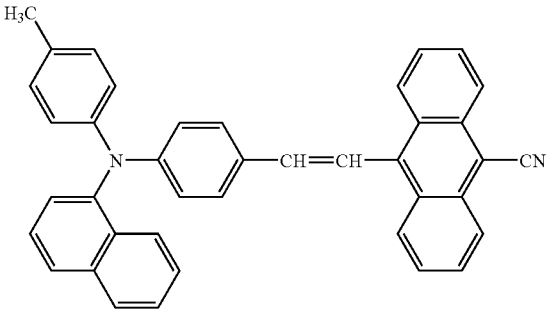

Compound (5)-16
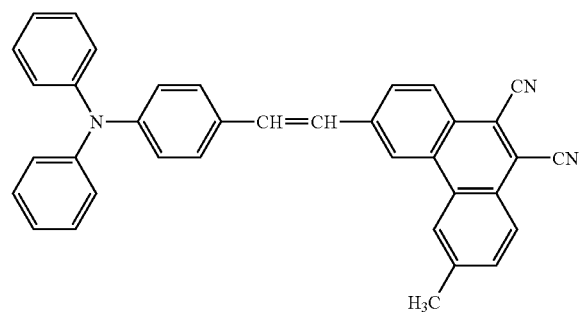
Compound (5)-20
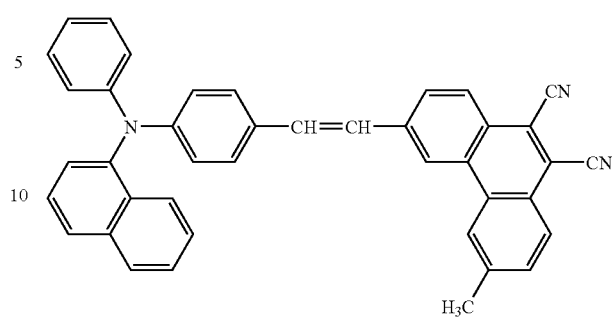
Compound (5)-17
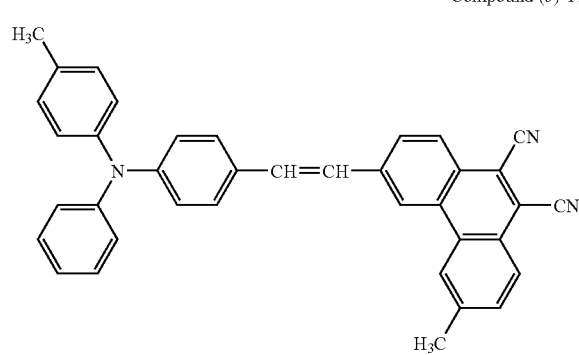
Compound (5)-21
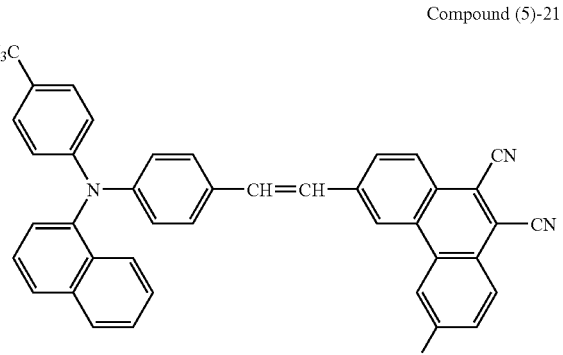
Compound (5)-18
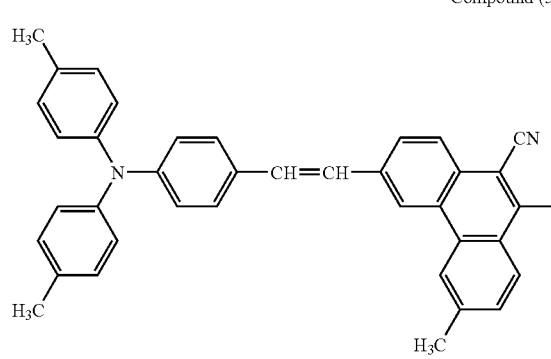
Compound (5)-22
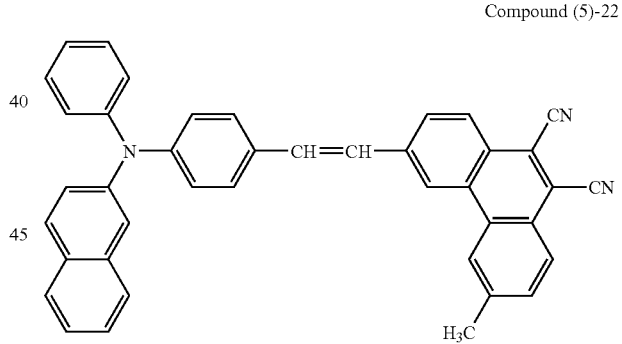
Compound (5)-19
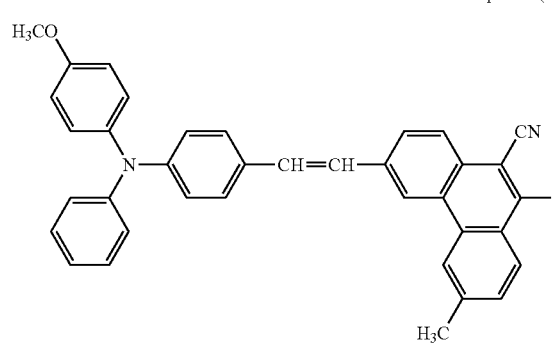
Compound (5)-23
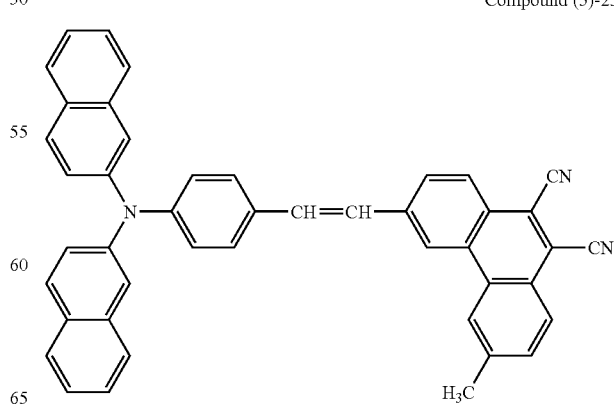

Compound (5)-24
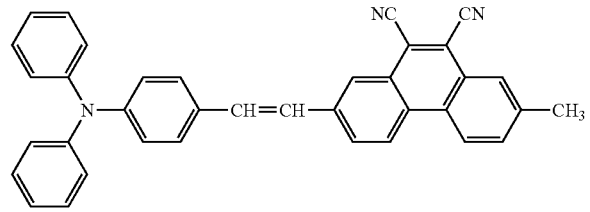
Compound (5)-25
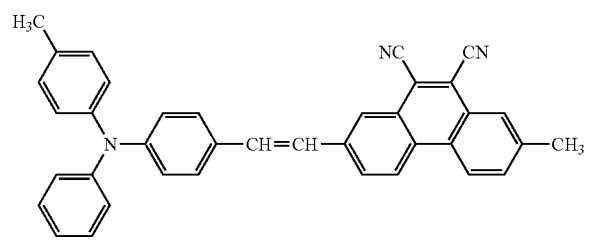
Compound (5)-26
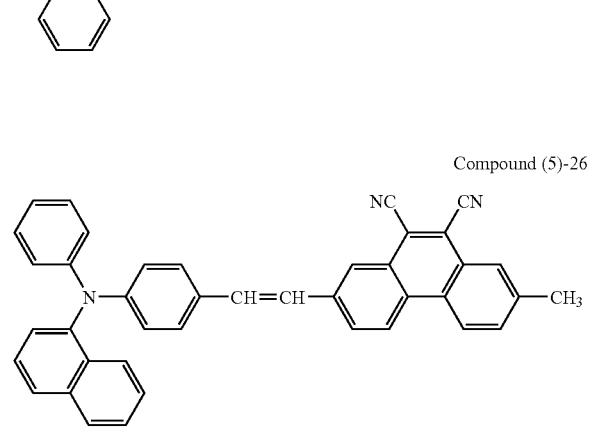
Compound (5)-27
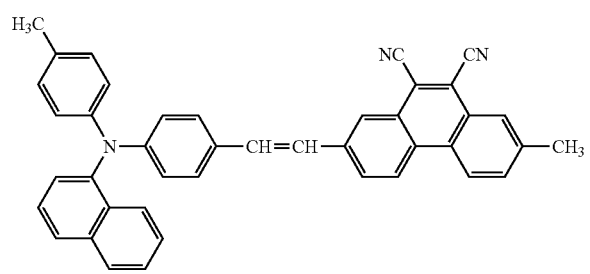
Compound (5)-28
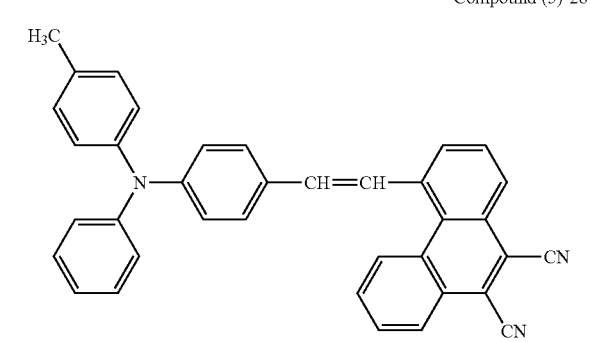
Compound (5)-29
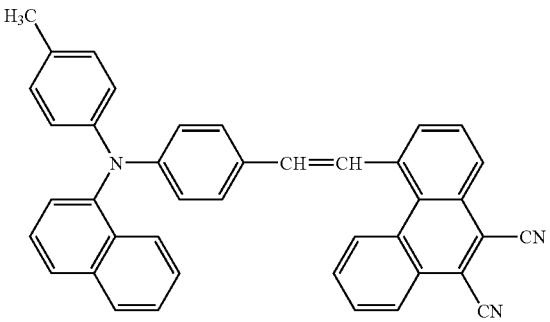
Compound (5)-30
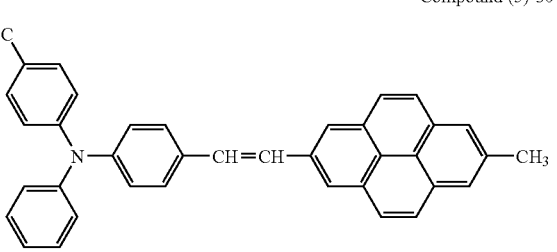
Compound (5)-31
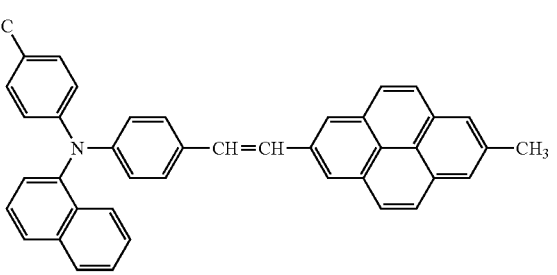
Compound (5)-32
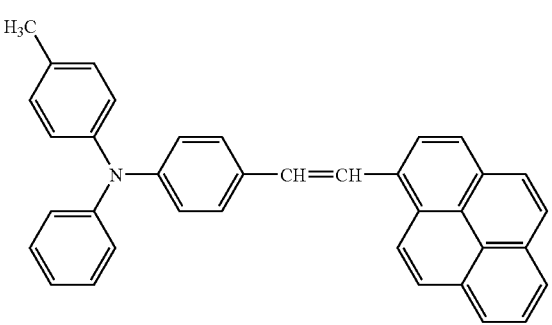
Compound (5)-33
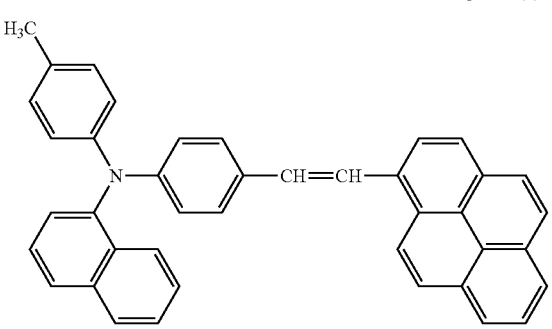

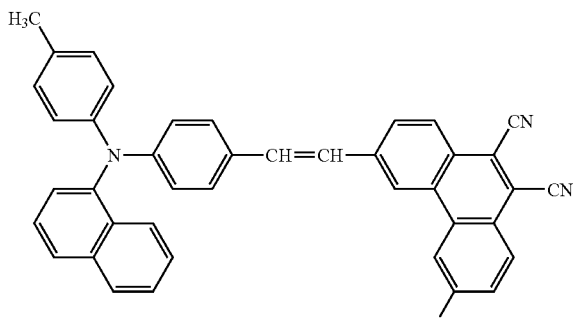

Compound (5)-34

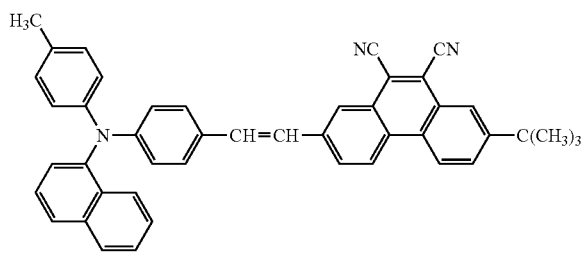

Compound (5)-35

The perylene derivative of the general formula (1), the diketopyrolopyrole derivative of the general formula (2), the pyromethene complex of the general formula (3), the pyrane derivative of the general formula (4) or the styryl derivative of the general formula (5), which is used as a red luminescent material of the transfer layer 17 as set out hereinabove, should preferably have a molecular weight of not greater than 2000, more preferably not greater than 1500 and most preferably not greater than 1000. The reason for this is that it is considered that if the molecular weight is great, there is concern that depositability becomes worsened in case where an element is made by vacuum deposition.

c) Aromatic Hydrocarbons

Specific examples of aromatic hydrocarbons whose matrix skeleton has four to seven rings include pyrene, triphenylene, fluoranthene, crycene, naphthacene, pentacene, perylene or coronene as a skeleton thereof. Besides, the following compounds wherein a benzene ring is added to may be mentioned, for example.

That is, mention is made of benzo[b]fluorene, benzo[c]phenanthrene, benzo[ghi]fluoranthene, benzo[a]anthracene, benzo[a]pyrene, benzo[e]pyrene, benzo[j]fluoranthene, benzo[a]naphthacene, benzo[b]crycene, benzo[c]crycene, benzo[ghi]perylene, dibenzo[a,c]anthracene, dibenzo[a,h]anthracene, dibenzo[a,j]anthracene, naphtho[a]anthracene, dibenzo[b,def]crycene, dibenzo[b,k]perylene, dibenzo[cd,lm]perylene, dibenzo[g,p]crycene, naphtho[bcd]perylene, phenanthro[3,4-c]phenanthrene, benzo[a]coronene, benzo[ghi]naphtho[cde]perylene, dibenzo[bc,ef]coronene, dinaphtho[defg,opqr]pentacene, naphtho[g]coronene, benzo[rst]dinaphtho[defg,ijkl]pentaphene, benzo[rst]phenanthro[1,10,9-cde]pentaphene, dibenzo[j,lm]naphtho[ab]perylene, tetrabenzo[a,cd,f,lm]perylene, pentabenzo[a,cd,f,j,lm]perylene and the like.

Further, these matrix skeletons may have a substituent group and may have hydrogen, a halogen, a hydroxyl group, a substituted or unsubstituted carbonyl group having not larger than 20 carbon atoms, a substituted or unsubstituted carbonyl ester group having not larger than 20 carbon atoms, a substituted or unsubstituted alkyl group having not lager than 20 carbon atoms, a substituted or unsubstituted alkenyl group having not larger than 20 carbon atoms, a substituted or unsubstituted alkoxyl group having not larger than 20 carbon atoms, a cyano group, a nitro group, a substituted or unsubstituted silyl group having not larger than 30 carbon atoms, a substituted or unsubstituted aryl group having not larger than 30 carbon atoms, a substituted or unsubstituted heterocyclic group having not larger than 30 carbon atoms, or a substituted or unsubstituted amino group having not larger than 30 carbon atoms.

The aryl group used as a substituent group bonded to the matrix skeleton includes, for example, a phenyl group, a 1-naphthyl group, a 2-naphthyl group, a fluorenyl group, a 1-anthryl group, a 2-anthryl group, a 9-anthryl group, a 1-phenathryl group, a 2-phenathryl group, a 3-phenathryl group, a 4-phenathryl group, a 9-phenathryl group, a 1-naphthacenyl group, a 2-naphthacenyl group, a 9-naphthacenyl group, a 1-pyrenyl group, a 2-pyrenyl group, a 4-pyrenyl group, a 1-crycenyl group, a 6-crycenyl group, a 2-fluoranthenyl group, a 3-fluoranthenyl group, a 2-biphenylyl group, a 3-biphenylyl group, a 4-biphenylyl group, an o-tolyl group, a m-tolyl group, a p-tolyl group, a p-t-butylphenyl group or the like.

The heterocyclic group used as the substituent group bonded to the matrix skeleton includes a five or six-membered aromatic heterocyclic group containing O, N or S as a heteroatom or a condensed polycyclic aromatic heterocyclic group having 2 to 20 carbon atoms.

Examples of the aromatic heterocyclic group and condensed polycyclic aromatic heterocyclic group include a thienyl group, a furyl group a pyrolyl group, a pyridyl group, a quinolyl group, a quinoxalyl group, an imidazopyridyl group, and a benzothiazole group. Typical examples include a 1-pyrolyl group, a 2-pyrolyl group, a 3-pyrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalynyl group, a 5-quinoxalynyl group, a 6-quinoxalynyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acrydinyl group, a 2-acrydinyl group, a 3-acrydinyl group, a 4-acrydinyl group, a 9-acrydinyl group, and the like.

In order to make the transfer layer 17 constituted of a) metal complex, b) fluorescent luminescent dopant and c) aromatic hydrocarbon as stated hereinabove, there may be used, aside from a dry process such as a vacuum deposition process, a wet process including a coating process such as a spin coating process, a dipping process, a doctor blade process, a jet coating process, a spray coating process or the like, or a printing process such as an ink jet process, an offset process, a letterpress process, an intaglio printing process, a screen printing process, a microgravure coating process or the like. Moreover, the dry and wet processes may be used in combination although depending on the properties of the respective materials used as a) metal complex, b) fluorescent luminescent dopant and c) aromatic hydrocarbon.

In the wet process, it is necessary to select a solvent depending on the properties or natures of the respective organic layers and the respective members. Specific examples of the solvent include, for example, ether solvents (monovalent alcohols) such as ethylene glycol monomethyl ether, ethylene glycol monoethyl ether, propylene glycol monomethyl ether and the like, glycols (divalent alcohols) such as ethylene glycol, diethylene glycol, propylene glycol and the like, polyols such as 1,2-hexanediol, 2,4,6-hexanetriol and the like, ketone solvents such as acetone, methyl ethyl ketone, methyl isobutyl ketone, cyclohexanone, 4-methoxy-4-methylpentanone and the like, hydrocarbon such as hexane, decane, cyclohexane, decalin and the like, ester solvents such as ethyl acetate, n-propyl acetate and the like, aprotic polar solvents such as N,N-dimethylformamide (DMF), dimethylsulfoxide (DMSO), N-methylpyrrolidone, γ-butyl lactone, 1,3-dimethyl-2-imidazolidinone, acetonitrile, tetrahydrofuran and the like, aromatic solvents such as benzene, toluene, xylene, mesitylene, chlorobenzene, tetralin and the like, and halomethane solvents such as chloroform, dichloromethane, dichloroethane and the like.

These solvent may be used singly or in combination of two or more.

<Method for Fabricating a Display Device>

FIG. 2A to FIG. 4B are, respectively, a sectional view showing the step of a method of fabricating a display device including a method of manufacturing an organic electroluminescent element using such a transfer substrate 1 as set out hereinbefore. The fabrication procedure is illustrated with reference to these figures.

Figure 2A:
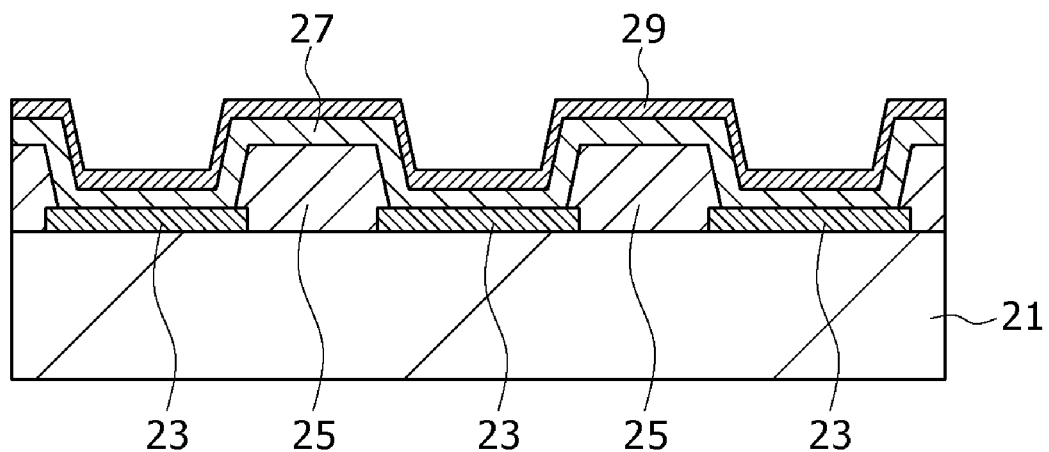
FIGS. 2A and 2B are schematic sectional views showing a step of a fabricating method of a display device including a method for making an organic electroluminescent element using the transfer substrate according to the embodiment.

Initially, as shown in FIG. 2A, a device substrate 21 on which organic electroluminescent elements are arrayed is provided. This device substrate 21 may be a known one in the art, for which there is used, for example, quartz, glass, a metal foil or a resin sheet or film. Of these, quartz or glass is preferred. With resin films or sheets, there are used, as a resin, methacrylic resins such as polymethyl methacrylate (PMMA), polyesters such as polyethylene terephthalate (PET), polyethylene naphthalate (PEN), polybutylene naphthalate (PBN) and the like, and polycarbonate resins. These resins should be used in the form of a laminated structure or after surface treatment so as to suppress water permeability and gas permeability. Alternatively, a TFT substrate wherein TFT (thin film transistor) is formed on a support substrate made of such a material as mentioned above may also be used. It will be noted that where a display device fabricated herein is of the transmission type wherein luminescence is taken out from the device substrate 21 side, the device substrate should be made up of a light transmissive material.

Next, a lower electrode 23 used, for example, as an anode is formed in a pattern on the device substrate 21.

The lower electrode 23 is made of an electrode material whose work function from a vacuum level thereof is so great as to efficiently inject holes. Such a material includes, for example, a metal such as aluminium (Al), chromium (Cr), molybdenum (Mo), tungsten (W), copper (Cu), silver (Ag) or gold (Au), an alloy thereof, or an oxide of the metal or alloy, an alloy of tin oxide ($SnO_2$) and antimony (Sb), ITO (indium tin oxide), InZnO (indium zinc oxide) and an alloy of zinc oxide (ZnO) and aluminium, or oxides of the metals or alloys. These may be used singly or in admixture.

The lower electrode 23 may be formed as a laminated structure that includes a first layer having excellent light reflectivity and a second layer formed on the top of the first layer and having optical transparency and a great work function.

In this case, the first layer is made of an alloy having aluminium as a main component. The sub-component may be one wherein at least one element whose work function is relatively smaller than aluminium used as the main component is contained. Such a sub-component preferably includes a lanthanide element. Although the work function of the lanthanide element is not so great, the stability of the anode containing these elements is improved and the hole injection property of the anode is satisfied. Aside from the lanthanide element, there may be contained another element, such as silicon (Si) or copper (Cu), as the sub-component.

The content of the sub-component in the aluminium alloy layer serving as the first layer is preferably in the range of about not larger than 10 wt % in total when Nd, Ni and/or Ti for stabilizing aluminium is used, for example. In doing so, while keeping the reflectivity in the aluminium alloy layer, the aluminium alloy layer can be stably held during the fabrication process of an organic electroluminescent element, and good processing accuracy and chemical stability are ensured. In addition, the lower electrode 23 can be improved in conductivity and adhesion with the substrate 1.

The second layer is, for example, a layer which is made of at least one of an aluminium alloy oxide, molybdenum oxide, zirconium oxide, chromium oxide and tantalum oxide. If, for example, an aluminium alloy oxide layer (including a natural oxide film) containing a lanthanide element as a sub-component is used as the second layer, the optical transparency of the second layer becomes good because of the high transparency of the oxide of a lanthanide element. This enables the reflectivity at the surface of the first layer to be held high. Moreover, the second layer may be a transparent, conductive layer made of ITO (indium tin oxide) or IZO (indium inc oxide). These conductive layers are able to improve an electron injection characteristic of the lower electrode 23.

The lower electrode 23 may be provided with a conductive layer at a side contacting the device substrate 21 so as to improve adhesion between the lower electrode 23 and the device substrate 21. Such a conductive layer is, for example, a transparent conductive layer made of ITO, IZO or the like.

Where a drive system of a display device arranged by use of the organic electroluminescent elements is of an active matrix type, the lower electrode 23 is provided as patterned for every pixel and connected to a drive thin film transistor provided on the device substrate 21.

Next, after formation of such a lower electrodes 23 (anodes herein) as set out above, an insulating film 25 is formed in pattern to cover the periphery of individual lower electrodes 23 therewith. This permits an exposed portion of the lower electrode 23 from a window formed in the insulating film 25 to be provided as a pixel region wherein individual organic luminescent elements are disposed. This insulating film 25 is constituted of an organic insulating material such as, for example, a polyimide, a photoresist or the like or an inorganic insulating film such as silicon oxide.

Thereafter, a hole injection layer 27 is formed as a common layer for covering the lower electrode 23 and the insulating film 25, followed by further formation of a hole transport layer 29 serving as a common layer for covering the hole injection layer 27.

The hole injection layer 27 and the hole transport layer 29 are, respectively, provided so as to enhance a hole injection efficiency to the luminescent layer. The materials for the hole injection layer 27 or hole transport layer 29 include, for example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or derivatives thereof, or polysilane compounds, vinyl carbazole compounds, thiophene compounds, or heterocyclic conjugated monomers, oligomers or polymers such as aniline compounds.

More specific materials for the hole injection layer 27 or hole transport layer 29 include α-naphthylphenylphenylenediamine, porphyrin, metal tetraphenylporphyrin, metal naphtalocyanine, hexacyanoazatriphenylene, 7,7,8,8-tratracyanoquinodimethane (TCNQ), 7,7,8,8-tetracyano-2,3-5,6-tetrafluoroquinodimethane (F4-TCNQ), tetracyano-4,4,4-tris(3-methylphenylphenylamino)triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), poly(2,2'-thienylpyrrole) and the like although not limited thereto.

The hole injection layer 27 ad hole transport layer 29 may be formed as a laminated structure wherein plural layers are laminated, respectively.

The steps set out hereinabove may be carried out in the same manner as ordinary steps of fabricating a display device using an organic electroluminescent element. In a next step, luminescent layers of the respective colors are formed on the thus formed hole transport layers by a thermal transfer process. In this step, the use of the transfer substrate 1 illustrated with reference to FIG. 1 is a characteristic feature of this embodiment.

Figure 2B:
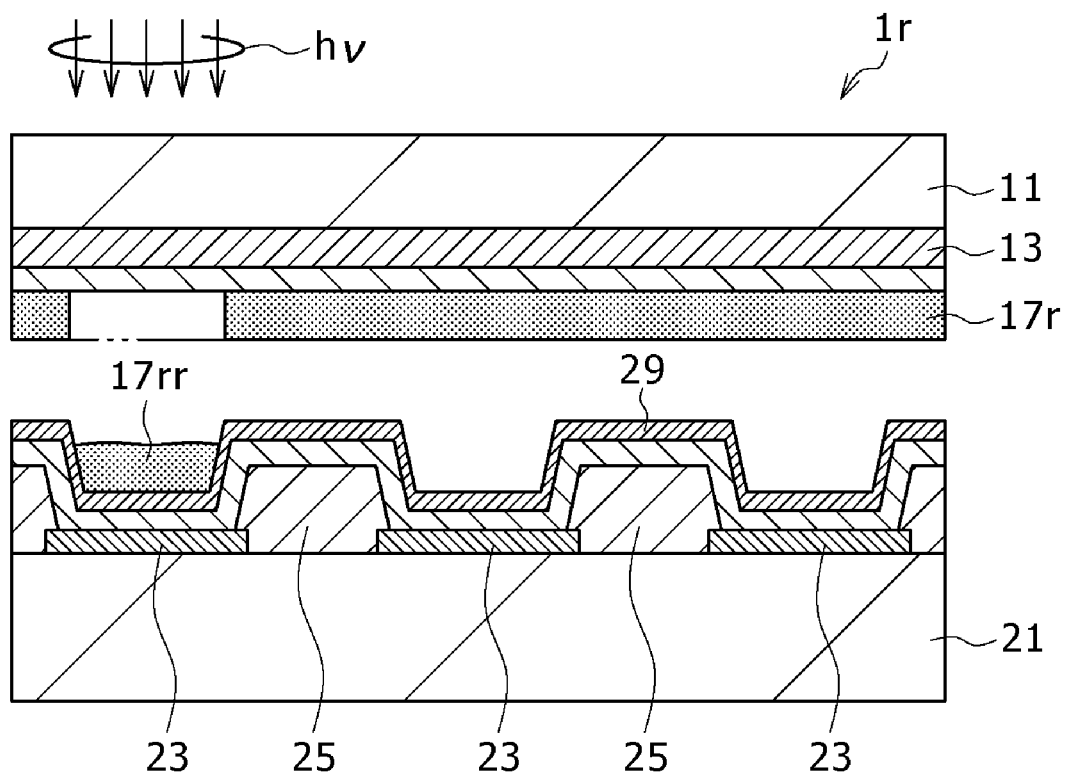

More particularly, as shown in FIG. 2B, the transfer substrate 1r having the red transfer layer 17r illustrated before is provided. This transfer substrate 1r is disposed in face-to-face relation with the device substrate 21 forming the hole transport layer 29 thereon.

The transfer substrate 1r and the device substrate 21 are so arranged that the transfer layer 17r and the hole transport layer 29 are facing each other. Moreover, the device substrate 21 and the transfer substrate 1r may be brought into intimate contact with each other so that the hole transport layer 29 which is an uppermost layer at the device substrate 21 side and the transfer layer 17r which is an uppermost layer at the transfer substrate 1r side are contacted with each other. In such a case, the transfer substrate 1r is left supported on the insulating film 25 at the device substrate 21 side, and the transfer substrate 1r does not contact with a portion of the hole transport layer 29 on the lower electrode 23.

In this condition, a laser beam hv of a wavelength, for example, of 800 nm is irradiated from the transfer substrate 1r side which is in face-to-face relation with the device substrate 21. On this occasion, the laser beam hv is spot-irradiated selectively on portions corresponding to red luminescent element-forming regions.

This permits the laser beam hv to be absorbed in the light-heat conversion layer 13 and the transfer layer 17r is sublimated by use of the heat to allow thermal transfer on the device substrate 21 side. In this way, a red luminescent layer 17rr, which is formed by thermally transferring the transfer layer 17r on the hole transport layer 29 formed on the device substrate 21 in high positional accuracy, is formed in pattern.

In such a thermal transfer, an irradiation energy is set at a relatively high level, so that the luminescent layer 17rr is formed as a mixed layer wherein the respective constituent materials of the transfer layer 17r are substantially uniformly mixed together.

It is important here that the laser beam hv be irradiated so as to completely cover, with the luminescent layer 17rr, the lower electrode 23 at the portion thereof exposed from the insulating film 25 in the luminescent element-forming portion (pixel region).

Figure 3A:
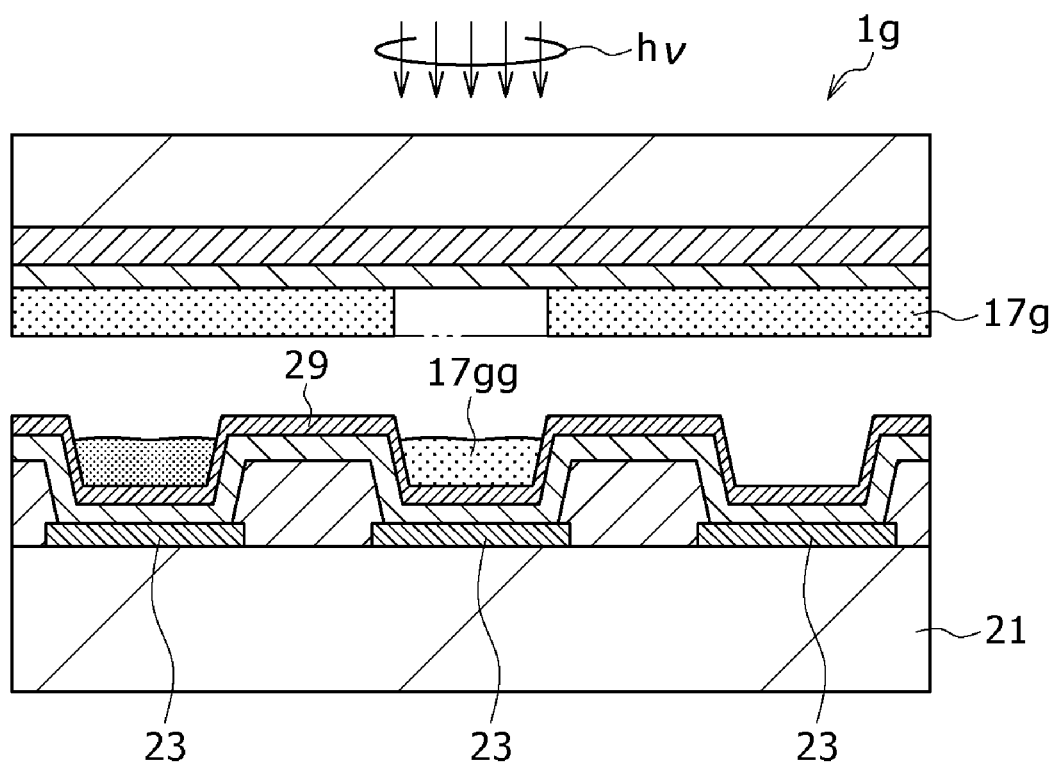
FIGS. 3A and 3B are schematic sectional views showing a step subsequent to the step of FIG. 2B.

Next, as shown in FIG. 3A, the transfer substrate 1g having the green transfer layer 17g, which is arranged as stated hereinbefore, is provided. This transfer substrate 1g is disposed in face-to-face relation with the device substrate 21 being formed a hole transport layer 29 thereon, followed by repeating such a thermal transfer step of irradiating a laser beam hv as set out above to form a green luminescent layer 17gg at a portion corresponding to a green luminescent element-forming region.

Figure 3B:
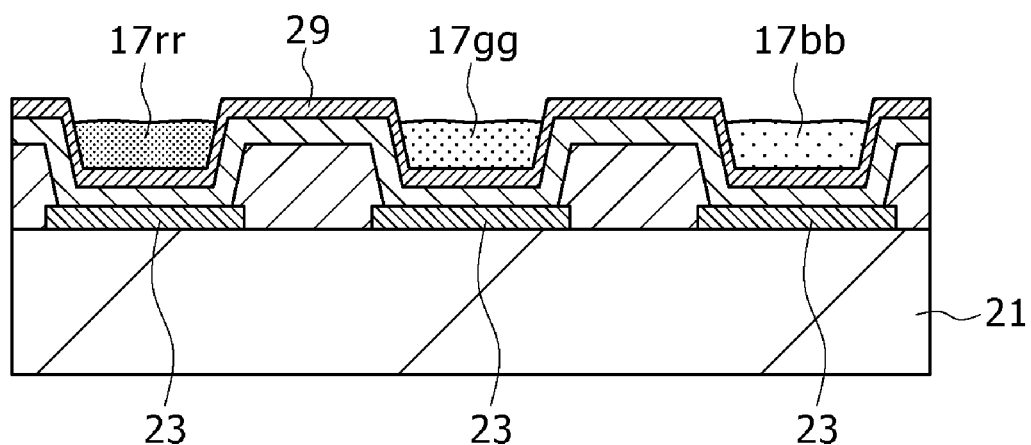

Thereafter, as shown in FIG. 3B, a blue luminescent layer 17bb is formed at a portion corresponding to a blue luminescent element-forming region. The formation of the blue luminescent layer 17bb may be carried out by a conventional thermal transfer process or by a vacuum deposition process.

It will be noted that although the thermal transfer steps repeated in this way may be carried out under an atmospheric pressure, it is preferred to carry out the steps in vacuum. When the thermal transfer is carried out in vacuum, a transfer using a laser of a lower energy becomes possible and an adverse thermal influence on the luminescent layer being transferred can be mitigated. Moreover, the thermal transfer step carried out in vacuum preferably increases mutual adhesion of the substrates, resulting in a good transfer pattern accuracy. In addition, when all the processes are continuously performed in vacuum, it may be possible to prevent the elements from being degraded.

In the step of the selective spot irradiation of the laser beam hv as set forth above, where the drive portion of a laser head of a laser beam irradiation device is provided with a precise alignment mechanism, the laser beam hv can be irradiated on the transfer substrate along the lower electrode 23 at an appropriate spot diameter. In this case, it is not necessary to exactly align the substrate 1 with the transfer substrate. On the other hand, where the drive portion of a laser head is not provided with a precise alignment mechanism, it is necessary to form, at the transfer substrate side, a light-shielding film that limits a region where the laser beam hv is irradiated. More particularly, a light-shielding film that is a high reflection metal layer reflecting a laser beam and provided with an opening is provided at a back surface of the transfer substrate 11. A low reflection metal may be formed on the light-shielding film. In this case, the alignment between the device substrate 2 and the transfer substrate 1 has to be made exactly.

Figure 4A:
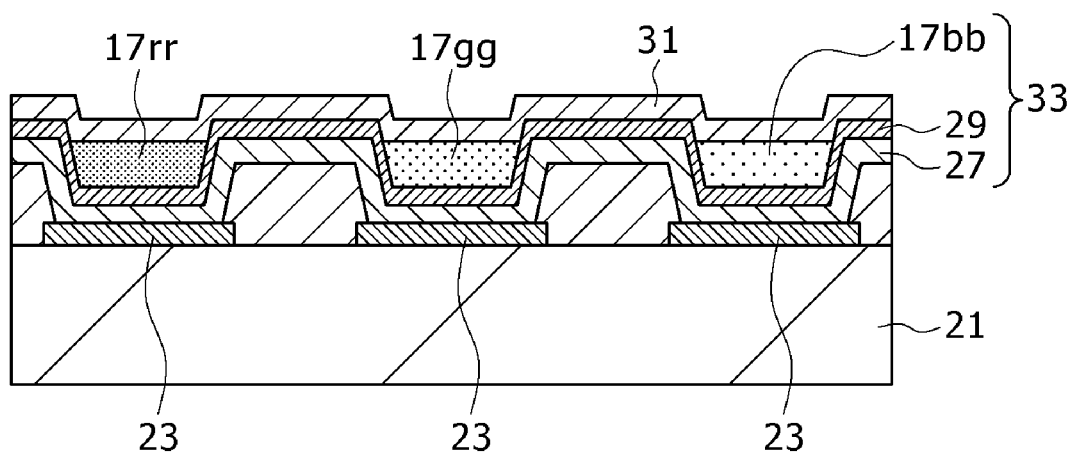
FIGS. 4A and 4B are schematic sectional views showing a step subsequent to the step of FIG. 3B.

Thereafter, as shown in FIG. 4A, an electron transport layer 31 is formed entirely over the device substrate 21, on which the respective color luminescent layers 17rr, 17gg and 17bb have been formed, according to a vacuum deposition film formation. This electron transport layer 31 is vacuum deposited and formed as a common layer over the entire surface on the device substrate 21.

This electron transport layer 31 is to transport electrons injected from the cathode to the luminescent layers 17rr, 17gg and 17bb. The materials for the electron transport layer 31 include, for example, quinoline, perylene, phenanthroline, bisstyryl, pyrazine, triazole, oxazole, oxadiazole, fluorenone, and derivatives or metal complexes thereof. Specific examples include tris(8-hydroxyquinoline)aluminium (abbreviated as Alq3), anthracene, naphthalene, phenanthrene, pyrene, perylene, butadiene, coumarin, acridine, stilbene, 1,10-phenanthroline, or derivatives and metal complexes thereof.

An organic layer 33 is constituted of the thus formed hole injection layer 27, hole transport layer 29, individual color luminescent layers 17rr, 17gg 17bb and electron transport layer 31.

Figure 4B:
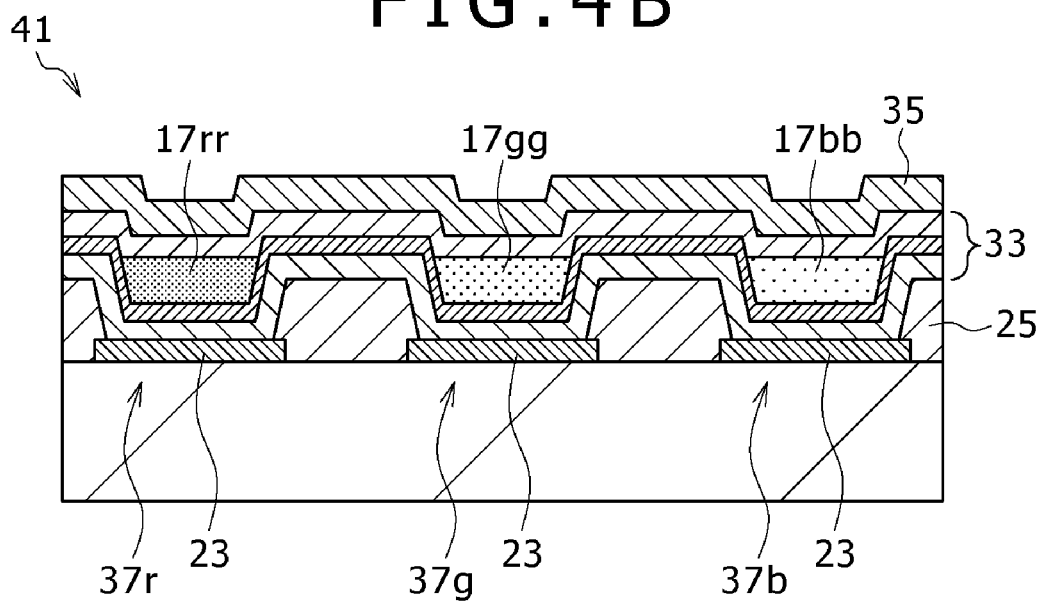

Next, as shown in FIG. 4B, an upper electrode (cathode herein) 35 is formed on the organic layer 33. The upper electrode 35 used as a cathode is constituted, for example, of a double-layered structure wherein a first layer and a second layer as viewed from the organic layer 33 side are laminated.

The first layer is made of a material that has a small work function and good light transmittivity. Examples of the material include lithium oxide ($Li_2O$) that is an oxide of lithium (Li), cesium carbonate ($Cs_2CO_3$) that is a composite oxide of cesium (Cs), and a mixture of the oxide and the composite oxide. The first layer 15a is not limited to the materials mentioned above and may be made, for example, of an alkaline earth metal such as calcium (Ca), barium (Ba) or the like, an alkali metal such as lithium, cesium or the like, or a metal whose work function is small, such as indium (In), magnesium (Mg) or the like. Moreover, oxides, composite oxides and fluorides of these metals may be used singly, or mixtures or alloys of the metals, and oxides, composite oxides and fluoride thereof may also be used so as to enhance stability thereof.

The second layer is made of a material having optical transparency, such as MgAg or the like, in the form of a thin film. This second layer 15b may also be in the form of a mixed layer containing an organic luminescent material such as an aluminium quinoline complex, a styrylamine derivative, a phthalocyanine derivative or the like. In this case, a layer having optical transparency and made, for example, of MgAg may be separately provided as a third layer.

Where a display device made herein is of an active matrix type, such an upper electrode 35 as set out above is formed as a blanket film over the device substrate 21 in such a state as to be insulated from the lower electrode 23 by means of the organic layer 33 and the insulating film 25 and is used as a common electrode of the individual pixels.

Individual organic electroluminescent elements, i.e. the red luminescent element 37r, green luminescent element 37g and blue luminescent element 37b, are formed at the respective portions where the organic layer 33 including the respective color luminescent layers 17rr, 17gg and 17bb is sandwiched in the laminated structure of the lower electrode 23 and the upper electrode 35.

It will be noted that the upper electrode 35 is not limited to a laminated structure of such a type as set out above, but an optimum combination or a laminated structure, which depends on the type of device fabricated, may be taken. For instance, the arrangement of the upper electrode 35 of the above embodiment is directed to a laminated structure wherein the functions of the respective layers of the electrode are separated from each other, i.e. an inorganic layer (first layer) facilitating injection of electrons into the organic layer 33 and an inorganic layer (second layer) serving as an electrode are separated from each other. However, the inorganic layer facilitating the electron injection into the organic layer 33 may be one that also serves as an electrode, and these layers may be formed as a single layer structure. Additionally, a transparent electrode such as ITO may be formed on this single layer structure to provide a laminated structure.

Although the electric current applied to the respective color luminescent elements 37r, 37g and 37b arranged in such a way as set out hereinbefore is usually a direct current, a pulse current or an alternating current may also be used. Although no limitation is placed on the current value or voltage value so far as they are used within ranges where the elements are not broken down, it is preferred that luminescence is generated efficiently by use of an electric energy being as small as possible when taking the consumption power and life of the organic electroluminescent element into consideration.

Where these organic electroluminescent elements 37r, 37g and 37b have each a cavity structure, the upper electrode 35 is constituted of a semi-transparent semi-reflective material. Luminescent light having being subjected to multiple interference between the light reflection surface at the lower electrode 23 side and the light reflection surface at the upper electrode 35 side is taken out from the upper electrode 35 side. In this case, the optical distance between the light reflection surface at the lower electrode 23 side and the light reflection surface at the upper electrode 35 side is defined by means of a wavelength of light to be taken out, and the thicknesses of the respective layers are so set as to satisfy the optical distance. In the organic electroluminescent element of such an upper surface luminescence type as set out above, when the cavity structure is positively used, an improvement in luminescence extraction efficiency to outside and control of luminescent spectra can be possible.

Furthermore, although not shown in the figures, it is preferred that the organic electroluminescent elements 37r, 37g and 37b are, respectively, used by coverage with a protective layer (passivation layer) so as to prevent the organic materials from degradation with moisture, oxygen and the like in air. For the protective film, there is used a silicon nitride (typically of which is $Si_3N_4$), a silicon oxide (typically of which is $SiO_2$) film, a silicon nitride-oxide ($SiN_xO_y$ with a compositional ratio of X>Y) film, a silicon oxide-nitride ($SiO_xN_y$ with a compositional ratio X>Y) film, a thin film mainly composed of carbon such as DLC (diamond like carbon, a CN (carbon nanotube) film, or the like. These films are preferably formed in single-layered or multi-layered structure. The protective film made of a nitride is dense in nature and is thus preferably used because of its very high blocking effect on moisture, oxygen and other impurities adversely influencing the organic electroluminescent elements 37r, 37g and 37b.

It will be noted that in the above embodiment, the invention is described in detail by using the case where the organic electroluminescent elements are of the upper surface luminescence type. However, the organic electroluminescent elements of the present invention are not limited to application to such an upper surface luminescence type as mentioned above, but may be widely applicable to such an arrangement wherein an organic layer having at least luminescent layer is held between the anode and the cathode. Accordingly, if a cathode, an organic layer and an anode are successively laminated in the order from a substrate side or if an electrode located at the same side as a substrate (i.e. a lower electrode for use as a cathode or anode) is constituted of a transparent material and an electrode located at a side opposite to the substrate (i.e. an upper electrode used as a cathode or anode) is constituted of a reflective material, the present invention is applicable to an organic electroluminescent element of a bottom surface luminescence type (so-called transmission type) which emits light only from the bottom electrode side.

The organic electroluminescent element fabricated herein may be one which is formed by sandwiching an organic layer between a pair of electrodes (anode and cathode). In this sense, the present invention is not limited to the arrangement including only a pair of electrodes and an organic layer, but other constituent elements or layers (e.g. an inorganic compound layer and an inorganic component) may be non-exclusively used within ranges not impeding the effect of the present invention.

Figure 5:
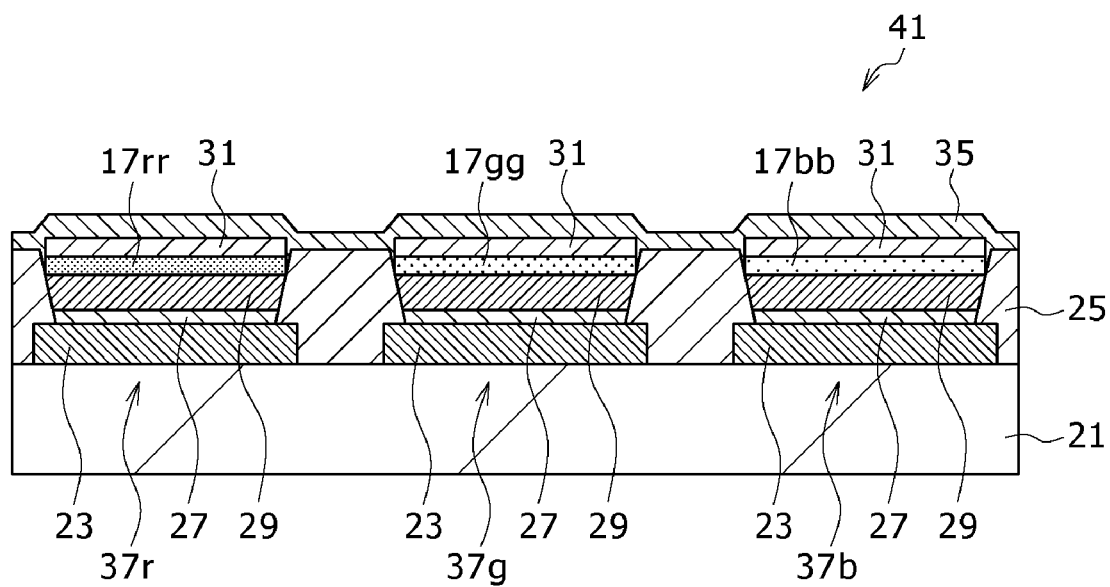
FIG. 5 is a schematic sectional view showing another type of display device obtained by a fabricating method according to another embodiment of the present invention.

It will be noted that the display device using the organic electroluminescent elements fabricated herein is not limited to one which is sectionally shown in FIG. 4B. For instance, a display device 41 having such an arrangement as shown in FIG. 5 may be used. It is to be noted that like members or elements as in the display device of FIG. 4B are designated by like reference numerals in FIG. 5.

More particularly, like a display device 41 as shown in FIG. 5, a hole injection layer 27 and a hole transport layer 29 may be patterned for every element. It is important to note that the red luminescent layer 17rr and the green luminescent layer 17gg formed on the hole transport layer 29 be, respectively, formed using a similar transfer substrate as illustrated with reference to FIGS. 2A to 3B. Moreover, the blue luminescent layer 17bb is formed by such a transfer process as set out above or by a vacuum deposition process.

The electron transport layers 31 of these luminescent layers 17rr, 17gg and 17bb may be patterned for every element.

The respective layers including the lower electrode layer 23 to the upper electrode 35 other than the luminescent layers 17rr, 17gg, 17bb illustrated hereinabove can be formed by a dry process such as a vacuum deposition process, an ion beam process (EB process), a molecular beam epitaxy process (MBE process), a puttering process, an organic vapor phase deposition (OVPD) process or the like.

The organic layers other than the luminescent layers 17rr, 17gg and 17bb may be formed by processes including, aside from the above-indicated processes, wet processes including coating processes such as a laser transfer process, a spin coating process, a dipping process, a doctor blade process, a jet coating process, a spray coating process and the like, and printing processes such as an ink jet process, an offset process, a letterpress process, an intaglio printing process, a screen printing process, a microgravure coating process and the like. Depending on the properties of the respective organic layers and members, the dry and wet processes may be used in combination.

It will be noted that as shown in FIG. 5, the respective portions of the organic layer formed as a pattern for every organic electroluminescent elements 37r, 37g or 37b may be formed, for example, by a vacuum deposition process or transfer process using a mask.

According to the transfer substrate 1 and the method of fabricating an organic electroluminescent element using the transfer substrate of the embodiments illustrated hereinbefore, the transfer layers 17r and 17g of the transfer substrates 1r and 1g are, respectively, formed of a ternary material or composition of a) metal complex, b) fluorescent luminescent dopant and c) aromatic hydrocarbon whose matrix skeleton has four to seven rings, so that the luminescent layers 17rr, 17gg formed by sublimation of the transfer layer 17 are also constituted of the ternary material. It has been confirmed that in the luminescent layers 17rr, 17gg composed of such a ternary material, although the aromatic hydrocarbon does not contribute to luminescence, a higher luminescent efficiency and a longer half-time luminance life are attained when compared with the case where no aromatic hydrocarbon is present. Moreover, the resulting luminescent layer is such that the three types of materials are more uniformly mixed and the hv material ratios are more accurately controlled than that formed by vacuum co-deposition.

Eventually, the luminescent layers 17rr, 17gg made of the ternary material capable of achieving a high luminance efficiency and an improved half-time luminance life can be formed more uniformly at more precise ratios. This makes it possible to obtain the organic electroluminescent elements 37r, 37g whose luminescence efficiency and half-time luminescence life are further improved.

Since the organic electroluminescent elements 37r, 37g having a high luminescence efficiency are used, the luminance life of the display device 41 can be improved and an effect of reducing consumption power is brought about. Accordingly, the elements can be favorably employed as a flat panel display or a flat luminescent body such as a wall-hung television and are also applicable to as a light source such as for duplicating machines and printers, a light source such as for liquid crystal displays, a display plate, a marker lamp and the like.

In the foregoing instances, embodiments wherein the present invention is applied to a display device of an active matrix type have been illustrated. As a matter of course, the display device of the present invention may be applicable to a passive matrix type with similar results being obtained.

<Schematic Arrangement of Display Device>

Figure 6A:
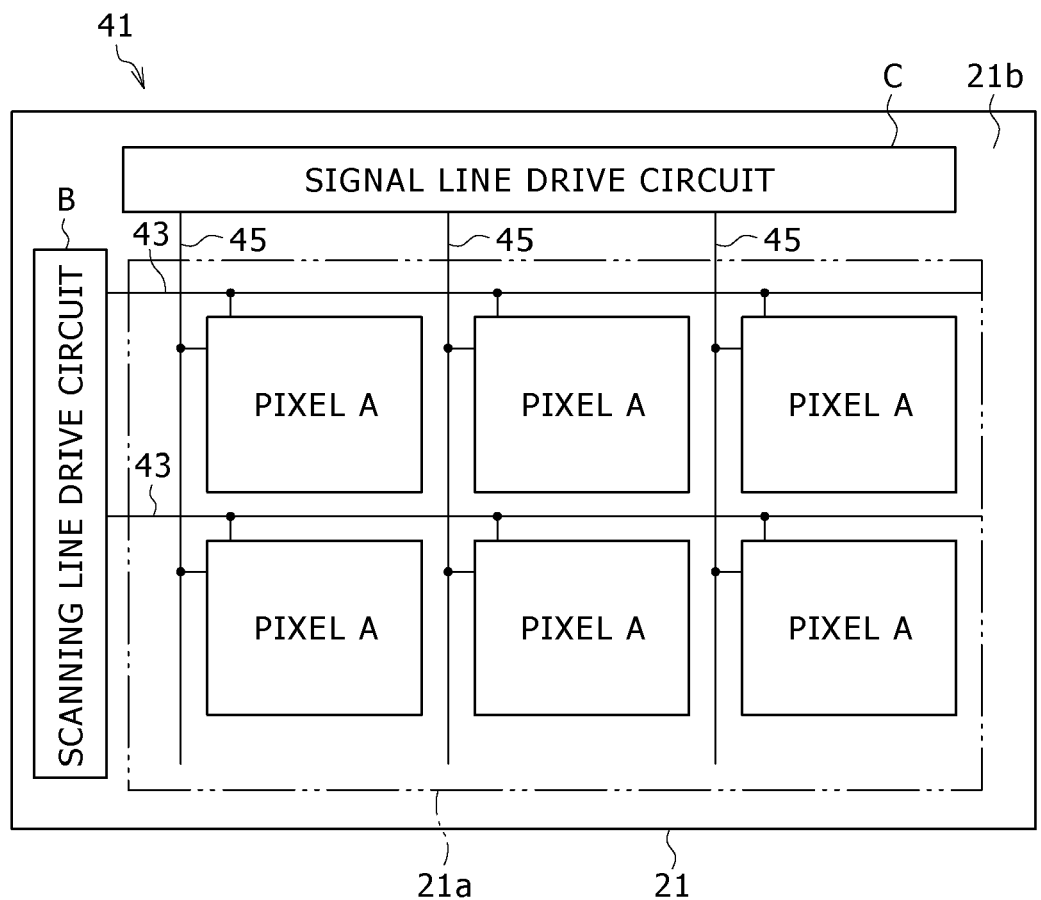
FIGS. 6A and 6B are circuit diagrams of the display device according to further embodiment of the present invention.
Figure 6B:
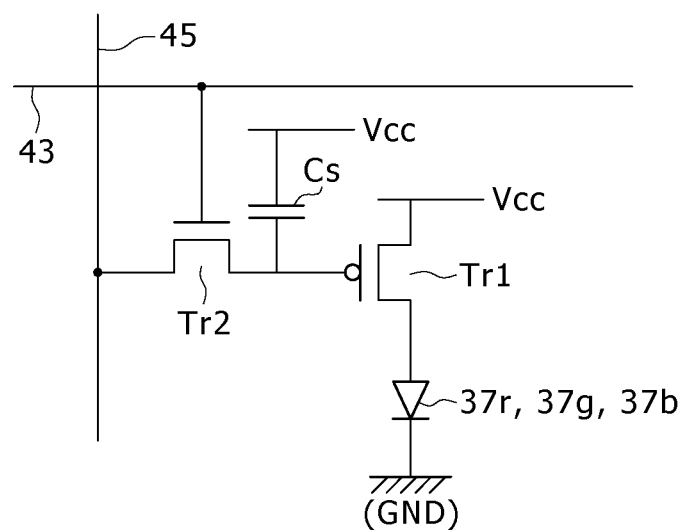

FIGS. 6A and 6B are a view showing an example of a display panel applied to a display device of the foregoing embodiments wherein FIG. 6A is a schematic view of the display panel and FIG. 6B is a pixel circuit diagram therefor. In these figures, there is shown a display panel of a display device 41 of an active matrix type using the organic electroluminescent elements 37r, 37g and 37b as a luminescent element.

As shown in FIG. 6A, a display region 21a and a peripheral region 21b are set on a device substrate 21 of the display device 41. The display region 21a has a plurality of scanning lines 43 and a plurality of signal lines 45 arranged in a matrix with one pixel A being provided at individual intersections to provide a pixel array unit as a whole. One of the organic electroluminescent elements 37r, 37g and 37b is provided at each of these pixels A. The peripheral region 21b is provided thereon with a scanning line drive circuit B for scan driving the scanning line 43 and a signal line drive circuit C for feeding a video signal (i.e. an input signal) corresponding to luminance information to the signal line 45.

As shown in FIG. 6B, a pixel circuit provided for every pixel A is constituted, for example, of one of the organic electroluminescent elements 37r, 37g and 37b, a drive transistor Tr1, a write transistor (sampling transistor) Tr2, and a storage capacitor Cs. When the scanning line drive circuit B drives the scanning line 43, the video signal supplied from the signal line 45 through the write transistor Tr2 is retained in the storage capacitor Cs. A current corresponding to an amount of stored signal is fed to the respective organic electroluminescent elements 37r, 37g and 37b, and the organic electroluminescent elements 37r, 37g and 37b emit luminescence at a luminance corresponding to the current value.

It will be noted that the arrangement of the pixel circuit illustrated above is shown only by way of example, and a capacitor element may be provided within the pixel circuit, if necessary, or a plurality of transistors may be provided to constitute a pixel circuit. Moreover, the peripheral region 21b should be additionally provided with a necessary drive circuit depending on the alteration of the pixel circuit.

Figure 7:
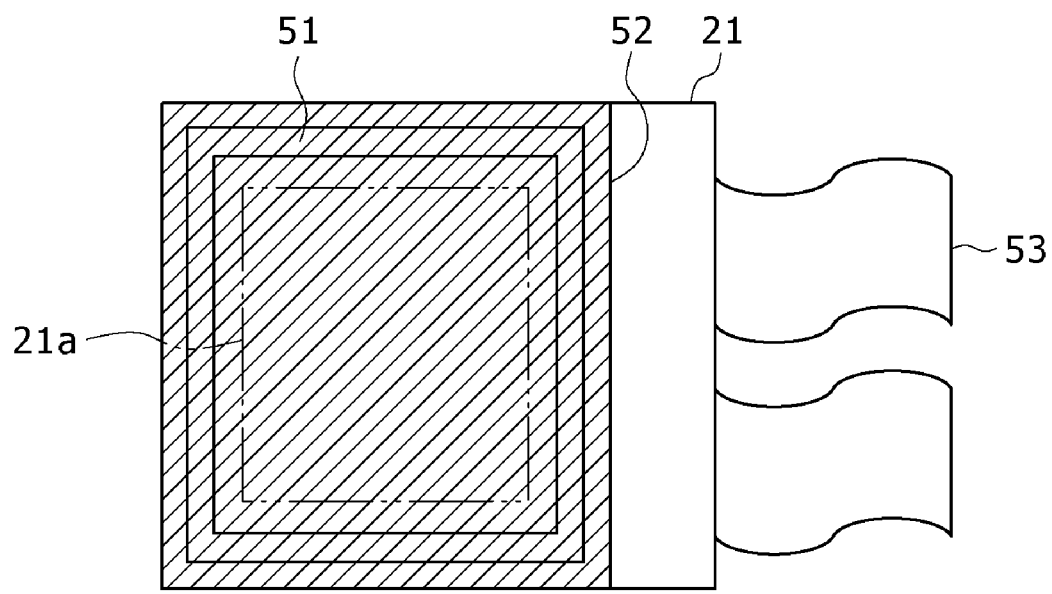
FIG. 7 is a schematic view showing a module-shaped display device of a sealed type to which the present invention is applied.

Such an arrangement of the display device 41 as set out above encompasses a sealed module shape as is particularly shown in FIG. 7. For instance, a sealing portion 51 is provided so as to surround the display region 21a serving as a pixel array unit, and this sealing portion 51 used as a bonding agent is bonded to an opposite unit (seal substrate 52) such as of transparent glass or the like, thereby providing a display module. This transparent seal substrate 52 may be provided with a color filter, a protective film, a light-shielding film and the like. It is to be noted that the device substrate 21 used as a display module forming the display region 21a thereon may be provided with a flexible printed board substrate 53 for permitting signals to be inputted from outside to the display area 21a or to be outputted from the display area 21a to outside.

APPLICATION EXAMPLES

The display device according to the above embodiment of the present invention is applicable as display devices to various types of electronic devices in all fields. The electronic devices displaying video signals inputted thereto or video signals produced therein as images or pictures, includes, for example, mobile terminal devices such as a notebook-sized personal computer, a cell phone and the like, a digital camera, a video camera, and the like display devices, as shown in FIGS. 8 to 12. Examples of the electronic devices to which the present invention is applicable are illustrated.

Figure 8:
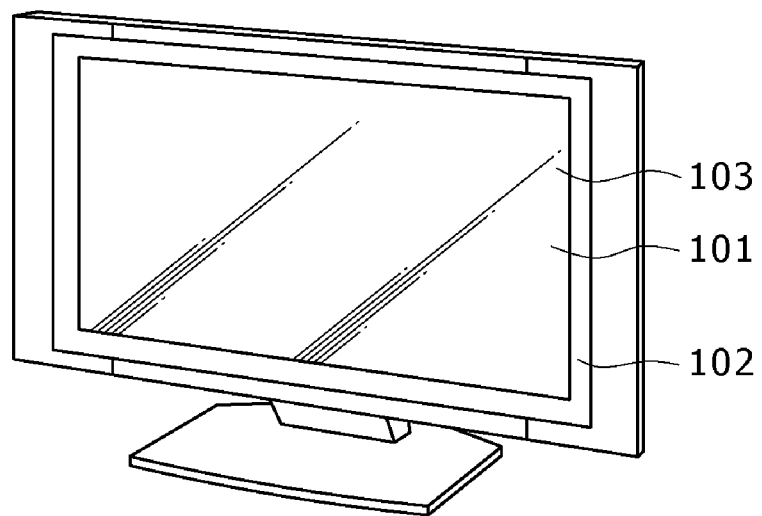
FIG. 8 is a perspective view showing a television set to which the present invention is applied.

FIG. 8 is a perspective view showing a television set to which the present invention is applied. The television of this application example includes a display screen unit 101 made up of a front panel 102, a filter glass 103 and the like wherein the display device of the invention is used as the display screen unit 101.

Figure 9A:
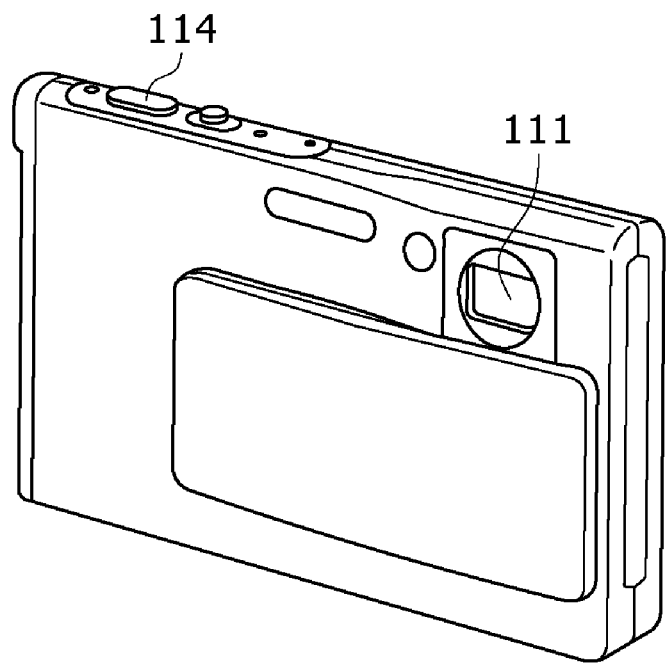
Figure 9B:
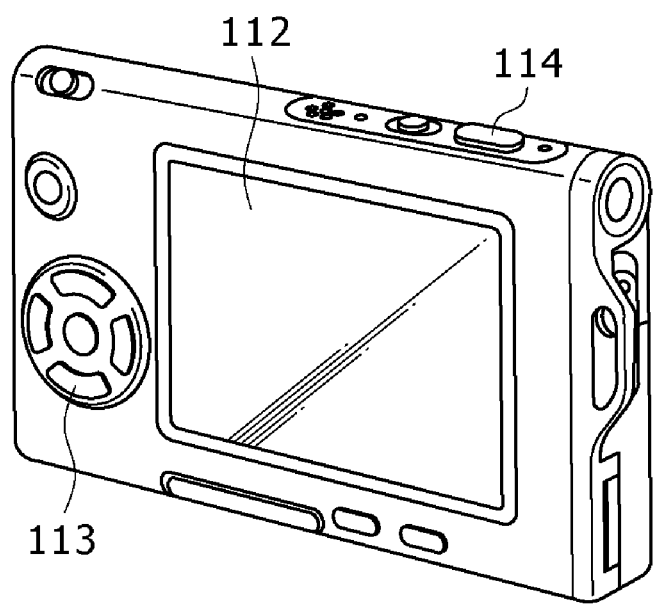

FIGS. 9A and 9B are, respectively, a schematic view showing a digital camera to which the invention is applied, wherein FIG. 9A is a perspective view as viewed from a front side and FIG. 9B is a perspective view as viewed from a back side. The digital camera of this application example includes a flash light emission unit 111, a display unit 112, a menu switch 113, a shutter button 114 and the like wherein the display device of the present invention is used as the display unit 12.

Figure 10:
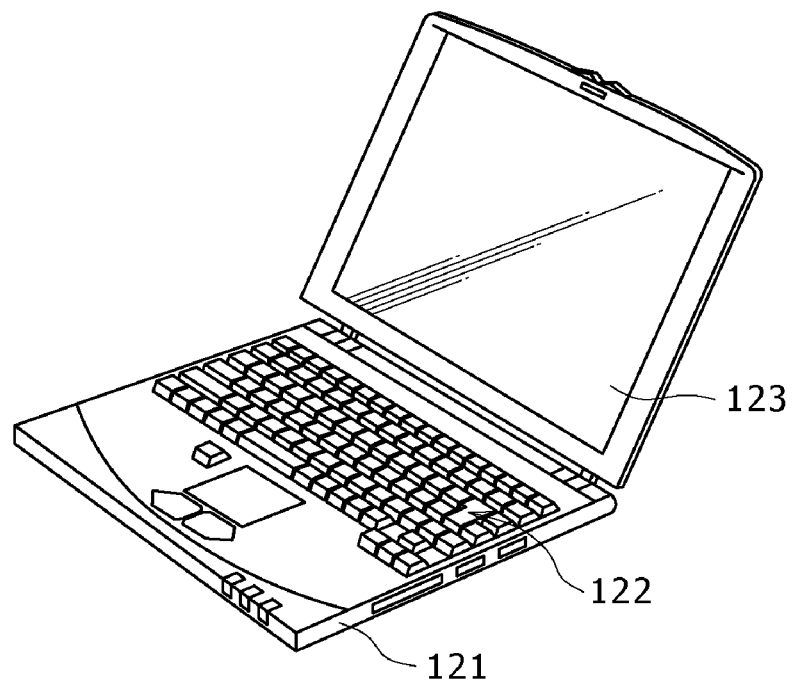
FIG. 10 is a perspective view showing a note-type personal computer, to which the present invention is applied.

FIG. 10 is a perspective view showing a notebook-sized personal computer to which the present invention is applied. The notebook-sized personal computer of this application example includes a body 121, a keyboard 122 used when inputting letters and the like, a display unit 123 displaying images and the like, wherein the display device of the present invention is used as the display unit 123.

Figure 11:
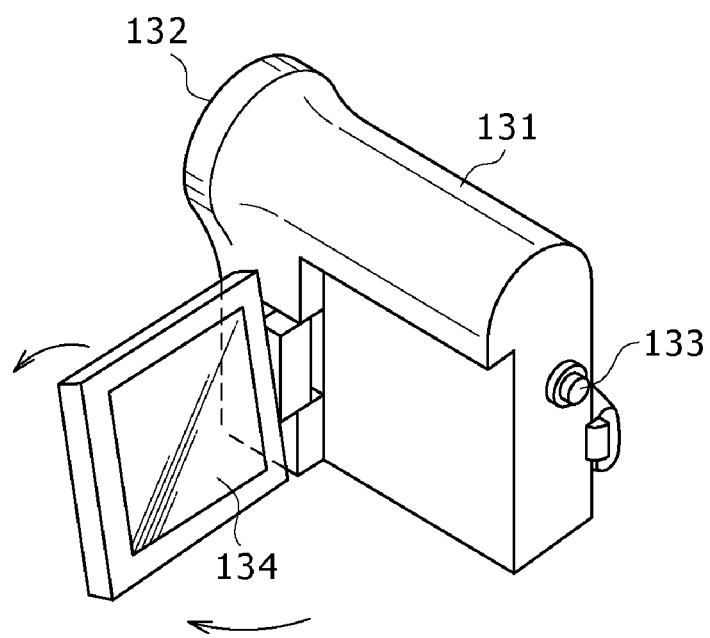
FIG. 11 is a perspective view showing a video camera, to which the present invention is applied.

FIG. 11 is a perspective view showing a video camera to which the invention is applied. The video camera of this application example includes a body 131, an objective lens 132 provided at a forwardly facing side, a shooting start/stop switch 133, a display unit 134 and the like, wherein the display device of the invention is used as the display unit 134.

FIGS. 12A to 12G are, respectively, a schematic view showing a portable terminal device, e.g. a cell phone to which the present invention is applied, wherein FIG. 12A is a front view showing the cell phone in an opened state, FIG. 12B is a side view thereof, FIG. 12C is a front view showing the cell phone in a closed state, FIG. 12D is a left side view, FIG. 12E is a right side view, FIG. 12F is a top view and FIG. 12G is a bottom view. The cell phone of this application example includes an upper casing 141, a lower casing 142, a connection (a hinge herein) 143, a display 144, a sub-display 145, a picture light 146, a camera 147 and the like. The portable terminal device is fabricated by using the display device to which the present invention is applied as the display 144 or the sub-display 145.

The fabricating procedures of organic electroluminescent elements of examples of the invention and comparative examples are described with reference to FIGS. 1 to 3B along with the results of evaluation thereof.

EXAMPLE 1

An organic electroluminescent element for a green light is fabricated as follows.

(1) Initially, a device substrate 21 made of a 30 mm×30 mm glass sheet was provided, on which a lower electrode (anode) 23 made of a 190-nm-thick Ag alloy (reflective layer) and a 12.5-nm-thick ITO transparent electrode laminated thereon was formed to make a cell for an organic electroluminescent element for upper surface luminescence. Next, a silicon oxide insulating film 25 was formed in a thickness of about 2 μm by a sputtering process so as to cover the periphery of the lower electrode 23 therewith, followed by exposing the lower electrode 23 by a lithographic method to provide a pixel region.

Next, according to a vacuum deposition process, a film of m-MTDATA of the following formula was formed as a hole injection layer 27 of an organic layer in a thickness of 12 nm (at a deposition rate of 0.2 to 0.4 nm/second). M-MTDATA means 4,4',4"-tris(phenyl-m-tolylamino)triphenylamine.

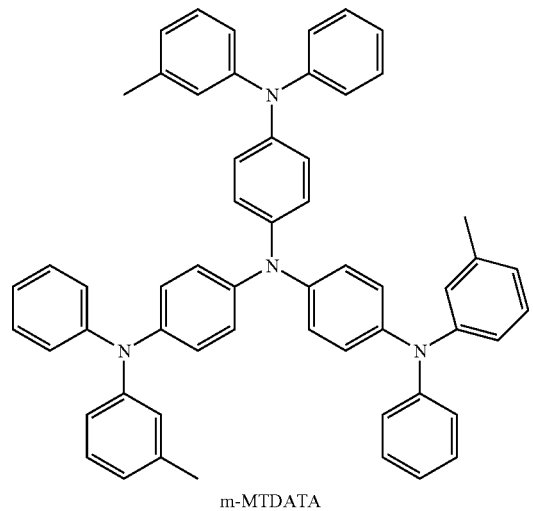

m-MTDATA

Thereafter, a film made of the following α-NPD was formed as a hole transport layer 29 in a thickness of 6 nm (at a deposition rate of 0.2 to 0.4 nm/second). The α-NPD means N,N'-bis(1-naphthyl)-N,N'-diphenyl[1,1'-biphenyl]-4,4'-diamine.

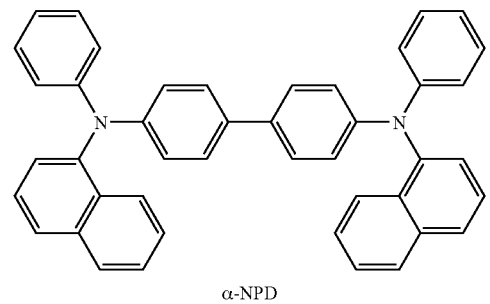

α-NPD (2) On the other hand, a transfer substrate 1g for forming a green luminescent layer thereon was made in the following way. Initially, a 200-nm-thick light-heat conversion layer 13 made of molybdenum was formed on a glass support substrate 21 according to an ordinary sputtering method. Next, a 100-nm-thick oxidation protective layer 15 made of silicon nitride $SiN_x$ was formed on the light-heat conversion layer 13 by a CVD process.

A 25-nm-thick transfer layer 17g was vacuum deposited on the oxidation protective layer 15. The transfer layer 17g was formed by ternary deposition of a) the following 8═-hydroxyquinoline aluminium (Alq3) as a metal complex, b) the following green fluorescent luminescent material of 10-(2-benzothiazolyl)-1,1,7,7-tetraethyl-2,3,6,7-tetrahydro-1H,5H,11H-benzo[I]pyrano[6,7,8-ij]quinolizin-11-one (C-545T: a commercial name of Aldrich Corporation) as a fluorescent luminescent dopant, and c) the following dibenzo[b,k]perylene as an aromatic hydrocarbon at relative thickness ratios of 79.5%, 0.5% and 20%, respectively.

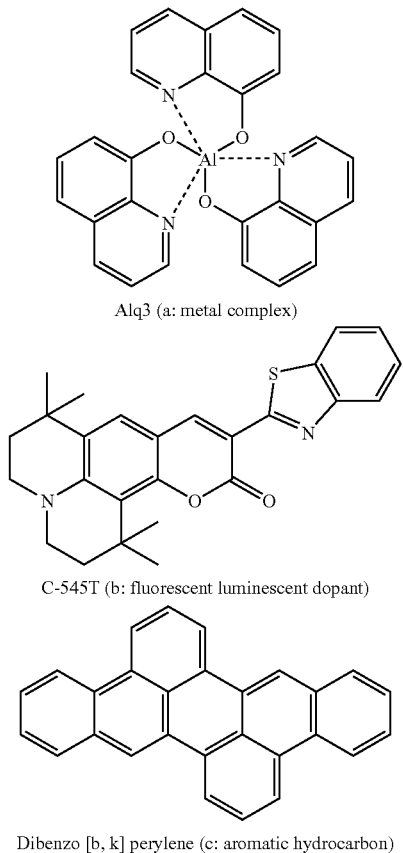

Alq3 (a: metal complex)

C-545T (b: fluorescent luminescent dopant)

Dibenzo [b, k] perylene (c: aromatic hydrocarbon)

(3) Next, the device substrate 21 and the transfer substrate 1g were placed in face-to-face relation with each other so that the hole transport layer 29 and the transfer layer 17g were facing each other, and were brought into intimate contact in vacuum. Both substrates had a space of about 2 μm kept over the lower electrode 23 ascribed to the thickness of the insulating film 25. In this condition, a laser beam with a wavelength of 800 nm was irradiated from the back side of the transfer substrate 1g at a position opposing to the pixel region of the device substrate 21 to thermally transfer the transfer layer 17g from the transfer substrate 1g to the device substrate 21 side by sublimation, thereby forming a green luminescent layer 17gg. The spot size of the laser beam was set at 300 μm×10 μm. The laser beam was scanned in a direction intersecting with the length of the beam. The energy density was at 2.6 $E^{-3}$ mj/μm$^2$.

(4) The device substrate 21 on which the luminescent layer 17gg had been formed by the transfer was heated at 100° C. for 30 minutes in an atmosphere of nitrogen used as an inert gas.

(5) After the heating, a blue luminescent layer obtained by mixing 9,10-di(2-naphthyl)anthracene (AND) of the following formula used as a host material and a styrylamine derivative of the following formula used as a blue luminescent guest material at a relative thickness ratio of 2.5% was laminated on the top of the luminescent layer 17gg by vacuum deposition. This blue luminescent layer is one which is formed as a common layer for individual pixels after formation of a red luminescent layer and a green luminescent layer as individual pixels by a transfer process when fabricating a full color display device and which does not influence luminescence of the green and red pixels.

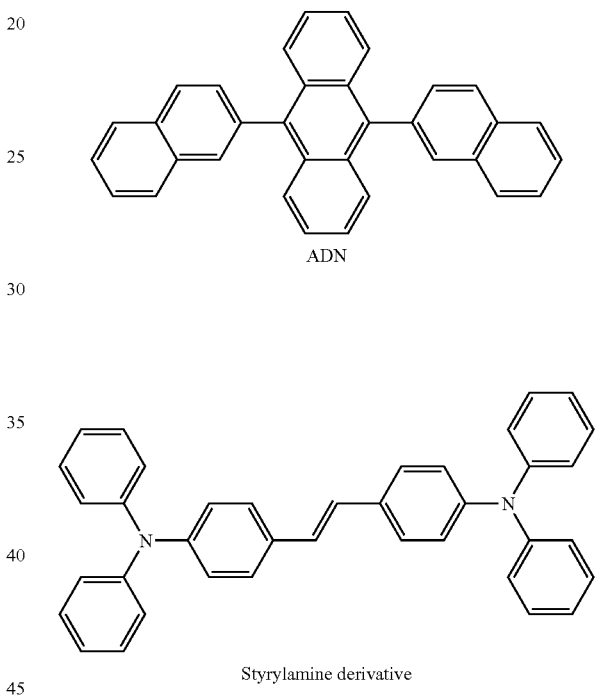

ADN

Styrylamine derivative (6) Next, 8═-hydroxyquinoline aluminium (Alq3) was vacuum deposited in a thickness of about 20 nm as an electron transport layer 31. Subsequently, LiF was vacuum deposited in a thickness of about 0.3 nm (at a deposition rate of up 0.01 nm/second) as an electron injection layer (or a first layer of an upper electrode). Thereafter, MgAg was vacuum deposited in a thickness of 10 nm as a cathode serving as an upper electrode 35 thereby obtaining a green luminescent element 37g.

EXAMPLES 2 AND 3 AND COMPARATIVE EXAMPLES 1, 2 AND 3

Example 1 was repeated except that materials indicated in the following Table 1 were used as a material for the transfer layer 17g in the procedure of making the transfer substrate 1g in (2) of Example 1, thereby obtaining a green luminescent element 37g. It will be noted that in Comparative Example 3,9,10-diphenylaminoanthracene was used in place of a) the metal complex used as a host material in Example 1.

TABLE 1

| | Transfer layer 17g | | | Luminance efficiency (cd/A) | Life (T90) (Hr) |
|---|---|---|---|---|---|
| | a) Metal complex (content) | b) Fluorescent luminescent dopant (content) | c) Aromatic hydrocarbon (content) | | |
| Example 1 | Alq3 (79.5%) | C-545T (0.5%) | Dibenzo[b,k]perylene (20.0%) | 13 | 120 |
| Example 2 | Gaq3 (79.5%) | C-545T (0.5%) | Dibenzo[b,k]perylene (20.0%) | 13 | 120 |
| Example 3 | Alq3 (65.0%) | 9,10-Diphenylaminoanthracene (5.0%) | Dibenzo[b,k]perylene (30.0%) | 15 | 100 |
| Comparative Example 1 | Alq3 (99.5%) | C-545T (0.5%) | | 12 | 20 |
| Comparative Example 2 | Alq3 (95.0%) | 9,10-Diphenylaminoanthracene (5.0%) | — | 13 | 25 |
| Comparative Example 3 | ADN (75.0%) | 9,10-Diphenylaminoanthracene (5.0%) | Dibenzo[b,k]perylene (20.0%) | 14 | 32 |

<Results of Evaluation-1>

The organic electroluminescent elements of Examples 1 to 3 and Comparative Examples 1 to 3 made in the way stated above were subjected to measurements of a luminance efficiency by driving at a current density of 10 mA/cm² and a time, as a life (T90), before a luminance obtained by application of a current density of 100 mA/cm² was reduced to 90%. The results are also shown in Table 1.

From these results of the measurements, it has been confirmed that the organic electroluminescent elements of Examples 1 to 3 wherein the respective transfer layers 17g are formed as containing dibenzo[b,k]perylene as c) an aromatic hydrocarbon along with a) metal complexes used as a host material and b) fluorescent luminescent dopants are remarkably improved in luminance life while keeping a luminance efficiency when compared with the organic electroluminescent elements of Comparative Example 1 and 2 wherein the transfer layer is free of c) aromatic hydrocarbon. The comparison between Examples 1 and 2 and Comparative Example 1, and also between Example 3 and Comparative Example 2 reveals that the luminance life is remarkably improved without depending on the green b) fluorescent luminescent dopant contained.

In Comparative Example 3, 9,10-diphenylaminoanthracene was used in place of a) the metal complex used as a host material in Example 1. In this case, although the luminous efficiency is kept, the life is poorer than those of Examples 1 to 3.

EXAMPLE 4

Example 1 was repeated except that the transfer layer 17g was formed as a double-layered structure in the procedure of making the transfer substrate 1g in (2) of Example 1, thereby obtaining a green luminescent element 37g. For the formation of the transfer layer 17g, a) a metal complex (Alq3) and b) a fluorescent luminescent dopant (C-545T) were vacuum co-deposited at a relative thickness ratio of 99.5%:0.5%. Next, c) an aromatic hydrocarbon (dibenzo[b,k]perylene) was vacuum deposited in a thickness of 5 nm to provide a double-layered structure.

The resulting organic electroluminescent element exhibited a luminous efficiency of 7.5 cd/A by driving at a current density of 10 mA/cm² and a life (T90) of 110 hours when driven at a current density of 100 mA/cm². When compared with the results of evaluation in Example 1, it has been confirmed that in the case where the transfer layer 17g is formed as a double-layered structure using the three types of materials a), b) and c) as the transfer layer 17g of the transfer substrate 1g, the resulting organic electroluminescent element using the transfer layer 17g is remarkably improved in luminance life over Comparative Examples 1 and 2

EXAMPLE 5

Example 1 was repeated except that the transfer layer 17g was formed as a three-layered structure in the procedure of making the transfer substrate 1g in (2) of Example 1, thereby obtaining a green luminescent element 37g. The transfer layer 17g was formed by initially vacuum depositing a) a metal complex (Alq3) in a thickness of 14 nm, subsequently b) a fluorescent luminescent dopant (9,10-diphenylaminoanthracene) in a thickness of 1 nm and finally c) an aromatic hydrocarbon (dibenzo[b,k]perylene) in a thickness of 5 nm to provide a three-layered structure.

The resulting organic electroluminescent element had a luminance efficiency of 7.5 cd/A when driven at a current density of 10 mA/cm² and a life (T90) of 110 hours when driven at a current density of 100 mA/cm². The comparison with the results of evaluation in Example 1 reveals that in the case where the transfer layer 17g is formed as a three-layered structure using the three types of materials a), b) and c) as the transfer layer 17g of the transfer substrate 1g, the resulting organic electroluminescent element using the transfer layer 17g is much remarkably improved in luminance life over Comparative Examples 1 and 2.

EXAMPLES 6 AND 7 AND COMPARATIVE EXAMPLE 4

Organic electroluminescent elements of red luminescence were made in the following way.

The general procedure of Example 1 was repeated except that the materials for forming the transfer layer 17g in the same manner as for the transfer substrate 1g in (2) of Example 1 were changed to materials for forming a transfer layer 17r that was used to form a red luminescent layer as indicated in Table 2, thereby obtaining a red luminescent element 37r.

In this regard, however, an oxidation protective layer 15 made of silicon nitride $SiN_x$ was formed in a thickness of 120 nm and the transfer layer 17r was formed in a thickness of 40 nm.

TABLE 2

| | Transfer layer 17r | | | Luminous efficiency (cd/A) | Life (T90) (hours) |
|---|---|---|---|---|---|
| | a) Metal complex (content) | b) Fluorescent luminescent dopant (content) | c) Aromatic hydrocarbon (content) | | |
| Example 6 | Alq3 (40.0%) | BSN (10.0%) | 3,10-Bis(2-naphthylperylene) (50.0%) | 6.1 | 90 |
| Example 7 | Alq3 (40.0%) | | 5,6,11,12-tetraphenyltetracene (50.0%) | 8.3 | 130 |
| Comparative Example 4 | Alq3 (90.0%) | | — | 5.7 | 20 |

<Results of Evaluation-2>

The thus fabricated organic electroluminescent elements of Examples 6 and 7 and Comparative Example 4 were subjected to measurements of a luminous efficiency by driving at a current density of 10 mA/cm$^2$ and a time, as a life (T90), before a luminance obtained by application of a current density of 70 mA/cm$^2$ was reduced to 90%. The results are also shown in Table 2 above.

From these results of the measurements, it has been confirmed that the organic electroluminescent elements of Examples 6 and 7 made as containing in the transfer layer 17r c) the aromatic hydrocarbon along with a) the metal complexes as a host material and b) the fluorescent luminescent dopant are improved in the luminous efficiency and remarkably improved in the luminous life over the organic electroluminescent element of Comparative Example 4 wherein the transfer layer is free of c) aromatic hydrocarbon. In addition, it will be apparent from Examples 6 and 7 that the luminance life is remarkably improved without depending on b) the red fluorescent luminescent dopant contained.

EXAMPLE 8

Example 6 was repeated except that the transfer layer 17r was formed as a double-layered structure in the procedure of making the transfer substrate 1r in (2) of Example 6, thereby obtaining a red luminescent element 37r. More particularly, the transfer layer 17r was formed by vacuum co-depositing a) metal complex (Alq3) and b) fluorescent luminescent dopant (BSN) at a relative thickness ratio of 80.0%:20.0% in a thickness of 20 nm. Next, c) aromatic hydrocarbon (3,10-bis(2-naphthyl)perylene) was vacuum deposited in a thickness of 20 nm to provide a double-layered structure.

The resulting organic electroluminescent element had a luminous efficiency of 6.0 cd/A when driven at a current density of 10 mA/cm$^2$ and a life (T90) of 95 hours when driven at a current density of 70 mA/cm$^2$. The comparison with the results of evaluation in Example 6 reveals that in the case where the transfer layer 17r is formed as a double-layered structure using the three types of materials a), b) and c) as the transfer layer 17r of the transfer substrate 1r, the resulting organic electroluminescent element using the transfer layer 17r is more remarkably improved in luminance life over Comparative Example 4.

EXAMPLE 9

Example 7 was repeated except that the transfer layer 17r was formed as a three-layered structure in the procedure of making the transfer substrate 1r in (2) of Example 7, thereby obtaining a red luminescent element 37r. The transfer 17r was formed by initially vacuum depositing a) metal complex (Alq3) in a thickness of 16 nm, subsequently b) fluorescent luminescent dopant (BSN) in a thickness of 4 nm, and finally c) aromatic hydrocarbon (5,6,11,12-tetraphenyltetracene) in a thickness of 20 nm to provide a three-layered structure.

The resulting organic electroluminescent element had a luminous efficiency of 8.5 cd/A when driven at a current density of 10 mA/cm$^2$ and a life (T90) of 125 hours when driven at a current density of 70 mA/cm$^2$. The comparison with the results of evaluation of Example 4 demonstrates that that in the case where the transfer layer 17r is formed as a three-layered structure using the three types of materials a), b) and c) as the transfer layer 17r of the transfer substrate 1r, the resulting organic electroluminescent element using the transfer layer 17r is more remarkably improved in luminance life over Comparative Example 4.

EXAMPLES 10 AND 11

The organic electroluminescent elements of red luminescence were made in the following way.

The materials for forming the transfer layer 17g in the procedure of making the transfer substrate 1g in (2) of Example 1 were changed to materials for forming a transfer layer 17r for forming a red luminescent layer indicated in Table 3 below. Except for this, Example 1 was repeated thereby obtaining a red luminescent element 37r.

It will be noted that an oxidation protective layer 15 made of silicon nitride $SiN_x$ had a thickness of 150 nm and the transfer layer 17r had a thickness of 40 nm.

TABLE 3

| | Transfer layer 17r | | | Luminous efficiency (cd/A) | Life (T90) (hours) |
|---|---|---|---|---|---|
| | a) Metal complex (content) | b) Fluorescent luminescent dopant (content) | c) Aromatic hydrocarbon (content) | | |
| Example 10 | Gaq3 (69.0%) | Compound (4)-2 (DCJTB) (1.0%) | 3,10-Bis(2-naphthylperylene) (30.0%) | 4.5 | 210 |
| Example 11 | Gaq3 (40.0%) | Compound (3)-21 (10.0%) | 5,6,11,12-Tetraphenylphenyl tetracene (50.0%) | 7.5 | 330 | b) Fluorescent luminescent dopants used are, respectively, a pyrane derivative of the following compound (4)-2, i.e. [4-(dicyanomethylene)-2-t-butyl-6-(1,1,7,7-tetramethylju-lolidyl-9-enyl-4H-pyrane (DCJTB)) and a pyromethene complex of the following compound (3)-21 which are illustrated in the foregoing embodiment.

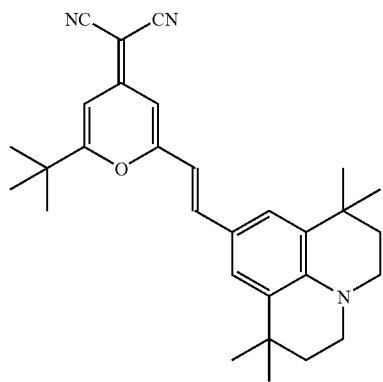

Compound (4)-2 pyrane derivative

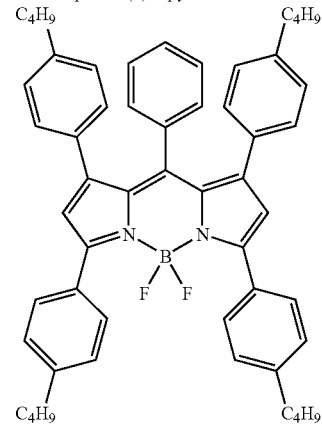

Compound (3)-21 Pyromethene complex

<Results of Evaluation-3>

The thus fabricated organic electroluminescent elements of Examples 10 and 11 were subjected to measurements of a luminous efficiency by driving at a current density of 10 mA/cm$^2$ and a time, as a life (T90), before a luminance obtained by application of a current density of 70 mA/cm$^2$ was reduced to 90%. The results are also shown in Table 3 above.

From these results of the measurements, it has been confirmed that the organic electroluminescent elements of Examples 10 and 11 made as containing in the transfer layer 17r c) the aromatic hydrocarbon along with b) the metal complexes as a host material and b) the fluorescent luminescent dopant are remarkably improved in the luminous life, without depending on the red b) fluorescent luminescent dopants, over the organic electroluminescent element of Comparative Example 4, as shown in Table 2, using the transfer layer that is free of c) aromatic hydrocarbon.

While preferred embodiments of the present invention have been described using specific terms, such description is for illustrative purpose only, and it is to be understood that changes and variations may be made without departing from the spirit or scope of the following claims.

What is claimed is:

1. A transfer substrate comprising:
   a light transmissive support substrate;
   a light-heat conversion layer formed on said light transmissive support substrate; and
   a transfer layer formed on said light heat conversion layer, wherein,
   said transfer layer is a layer which is transferable as a luminescent layer of an organic electroluminescent element and is made of a ternary material of metal complex, a fluorescent luminescent dopant and an aromatic hydrocarbon whose matrix skeleton has four to seven rings.

2. The transfer substrate according to claim 1, wherein said metal complex is a complex in which quinolinol is coordinated to a metal selected from aluminium, gallium and indium.

3. The transfer substrate according to claim 1, wherein said aromatic hydrocarbon is used in an amount within a range of not larger than 50 wt % in said transfer layer.

4. The transfer substrate according to claim 1, wherein said transfer layer has a laminated structure including a mixed sub-layer of said metal complex and said fluorescent luminescent dopant and a sub-layer of said aromatic hydrocarbon.

5. The transfer substrate according to claim 1, wherein said transfer layer has a laminated structure including a sub-layer made of said metal complex, a sub-layer of said fluorescent luminescent dopant, and a sub-layer made of said aromatic hydrocarbon.

6. The transfer substrate according to claim 1, wherein said fluorescent luminescent dopant is made of a green luminescent material or a red luminescent material.

7. A method for fabricating an organic electroluminescent element comprising the steps of:
   forming a pattern of a lower electrode on a device substrate;
   forming an organic layer including at least a luminescent layer on said lower electrode; and
   forming an upper electrode laminated on said lower electrode through said organic layer, wherein,
said luminescent layer is formed by
- providing a transfer substrate obtained by forming, on a light transmissive support substrate, a light heat conversion layer and a transfer layer made of a ternary material of metal complex, a fluorescent luminescent dopant and an aromatic hydrocarbon whose matrix skeleton has four to seven rings,
- placing said transfer substrate in face-to-face relation with said device substrate in such way that said transfer layer is opposed to a side of said device substrate, and
- sublimating said transfer layer by beam irradiation from a side of said support substrate to transfer said transfer layer to above of said device substrate.

* * * * *